(12) United States Patent
Kwack

(10) Patent No.: US 7,785,940 B2
(45) Date of Patent: Aug. 31, 2010

(54) TFT ARRAY SUBSTRATE AND METHOD FOR FABRICATING THE SAME

(75) Inventor: Hee Young Kwack, Seoul (KR)

(73) Assignee: LG Display Co., Ltd., Seoul (KR)

( * ) Notice: Subject to any disclaimer, the term of this patent is extended or adjusted under 35 U.S.C. 154(b) by 126 days.

(21) Appl. No.: 11/643,793

(22) Filed: Dec. 22, 2006

(65) Prior Publication Data
US 2007/0152220 A1 Jul. 5, 2007

(30) Foreign Application Priority Data
Dec. 30, 2005 (KR) .................. 10-2005-0134994

(51) Int. Cl.
*H01L 27/14* (2006.01)
*H01L 29/04* (2006.01)
(52) U.S. Cl. .................. 438/151; 257/59; 257/E29.117
(58) Field of Classification Search .................. 257/59, 257/72, E29.117
See application file for complete search history.

(56) References Cited

U.S. PATENT DOCUMENTS

| | | | |
|---|---|---|---|
| 6,077,730 A * | 6/2000 | Lee et al. | 438/149 |
| 6,188,452 B1 * | 2/2001 | Kim et al. | 349/43 |
| 6,292,237 B1 * | 9/2001 | Hebiguchi | 349/39 |
| 6,338,989 B1 * | 1/2002 | Ahn et al. | 438/158 |
| 6,362,031 B1 * | 3/2002 | Yamaguchi et al. | 438/158 |
| 6,429,057 B1 * | 8/2002 | Hong et al. | 438/158 |
| 6,740,596 B2 * | 5/2004 | Hayase et al. | 438/706 |
| 2004/0232421 A1 * | 11/2004 | Ono et al. | 257/59 |
| 2006/0138426 A1 * | 6/2006 | Yoo et al. | 257/72 |
| 2007/0164284 A1 * | 7/2007 | Park et al. | 257/59 |

* cited by examiner

*Primary Examiner*—Benjamin P Sandvik
(74) *Attorney, Agent, or Firm*—McKenna Long & Aldridge

(57) ABSTRACT

A four-mask process thin film transistor (TFT) array substrate and a method for fabricating the same is disclosed, which prevents a semiconductor tail from being formed. An open area is thus obtained and wavy noise is prevented from occurring. The method of fabricating a TFT array substrate comprises: forming a gate line, a gate electrode and a pad electrode on a substrate; sequentially depositing a gate insulation layer, a silicon layer and a metal layer on an entire surface of the substrate including the gate line; forming an open area in the pad electrode; forming a semiconductor layer, data line and source/drain electrodes by patterning the silicon layer and the metal layer; and forming a pixel electrode connected with the drain electrode and a transparent conductive layer connected with the pad electrode by depositing and patterning a transparent conductive material on the entire surface of the substrate including the data line, and simultaneously defining a channel region by separating the source and drain electrodes from each other.

19 Claims, 30 Drawing Sheets

TFT ARRAY SUBSTRATE AND METHOD FOR FABRICATING THE SAME

This application claims the benefit of Korean Patent Application No. P2005-134994, filed on Dec. 30, 2005, which is hereby incorporated by reference for all purposes as if fully set forth herein.

BACKGROUND OF THE INVENTION

1. Field of the Invention

The present invention relates to a liquid crystal display (LCD) device, and more particularly, to a four-mask process thin film transistor (TFT) array substrate and method for fabricating the same that prevent a semiconductor tail from being formed. An open area is obtained and wavy noise is prevented from occurring.

2. Discussion of the Related Art

Among the various flat displays, LCD devices have attracted much attention because of their high contrast ratio, good gray scale, high-quality moving picture image, and low power consumption.

Various patterns of driving elements or lines are provided on a substrate to drive an LCD device. These patterns may be formed by photolithography.

Photolithography involves complicated steps such as coating a film layer of a substrate with photoresist which is sensitive to ultraviolet rays, performing exposure and development of the substrate after positioning an exposure mask above the substrate, etching the film layer by using the patterned photoresist as a mask, and stripping the photoresist.

A TFT array substrate of a related art LCD device may include a gate line layer, a gate insulation layer, a semiconductor layer, a data line layer, a passivation layer, and a pixel electrode. Typically, five to seven masks are needed in order to form the above-mentioned elements on the TFT array substrate. Increasing the number of masks used by photolithography results in a greater probability of defects.

Recently, to overcome this problem, low-mask technology has been actively studied, which improves productivity and improves the process margin by fabricating the substrate using the minimum number of masks and photolithography.

Hereinafter, a method for fabricating a related art TFT array substrate will be explained with reference to the accompanying drawings.

FIGS. 1A to 1G are cross sectional views illustrating a method for fabricating a related art TFT array substrate. FIG. 2 is a cross sectional view illustrating defects of a related art TFT array substrate.

To form the related art TFT array substrate of the LCD device, as shown in FIG. 1A, aluminum neodymium (AlNd) and molybdenum (Mo) are deposited on a substrate 11, and are patterned by photolithography using a first mask, thereby forming a multitude of gate lines (not shown), a gate electrode 12a, a lower capacitor electrode 32, and a gate pad electrode (G.P) 22. The multitude of gate lines, the gate electrode 12a, and the lower capacitor electrode 32 are formed in an active region, and the gate pad electrode (G.P) 22 is formed in a pad region.

Then, an inorganic material of silicon oxide (SiOx) or silicon nitride (SiNx), by way of example, is deposited on an entire surface of the substrate 11 including the gate electrode 12a under high temperature conditions, thereby forming a gate insulation layer 13. Thereafter, an amorphous silicon layer (a-Si) 14d and a metal layer 15d of molybdenum (Mo) are sequentially deposited on the entire surface of the substrate 11 including the gate insulation layer 13. Thereon, a photoresist 50 is coated and is patterned by photolithography using a second mask, thereby patterning the photoresist 50 having a step coverage. The second mask may be a diffraction exposure mask, for example, a slit mask or a half-tone mask, to form the step coverage in the photoresist.

Then, the exposed amorphous silicon layer 14d and metal layer 15d are etched using the photoresist 50 having the step coverage as a mask, thereby forming a multitude of data lines (not shown), source and drain electrodes 15a and 15b, and a semiconductor layer 14, as shown in FIG. 1B. A two-step etching method is applied that includes a wet-etching step for the metal layer 15d and a dry-etching step for the amorphous silicon layer 14d.

As shown in FIG. 1C, the thickness of the photoresist 50 is decreased by ashing the photoresist 50, to thereby expose the metal layer corresponding to a channel region of a thin film transistor (TFT). Then, the exposed metal layer is etched by wet-etching so that the source and drain electrodes 15a and 15b are separated from each other, thereby further defining the channel region.

When ashing the photoresist, the width and thickness of photoresist are decreased, whereby an active layer 14 and the source/drain electrodes 15a/15b slightly protrude out of the edge of the photoresist. When performing wet-etching to separate the source and drain electrodes from each other, the protruding portion of the metal layer is etched together, but the active layer is not etched. The protruding portion of the active layer, which is protruding out of the source and drain electrodes, is referred to as a semiconductor tail 14a.

As shown in FIG. 2, the semiconductor tail 14a protrudes out from the data line 15 as well as the source and drain electrodes 15a and 15b.

Accordingly, an active region includes a plurality of data lines (not shown), a semiconductor layer 14, source/drain electrodes 15a/15b, and a pad region with a data pad electrode (not shown). The semiconductor layer may be etched with the data line and the source/drain electrodes together, so that the semiconductor layer has substantially the same pattern as that of the data line and the source/drain electrodes.

Thus, the deposited gate electrode 12a, gate insulation layer 13, semiconductor layer 14 and source/drain electrodes 15a/15b form the thin film transistor that controls the voltage-on/off state applied to a sub-pixel.

As shown in FIG. 1E, after removing the photoresist 50, an organic insulation material of BCB or an inorganic insulation material of SiNx is formed on the entire surface of the substrate including the source and drain electrodes 15a and 15b, thereby forming a passivation layer 16.

After that, as shown in FIG. 1F, the passivation layer 16 is partially removed by photolithography using a third mask, to thereby form a contact hole 71 which exposes the drain electrode 15b. By removing the passivation layer 16 and the gate insulation layer 13, a pad open area 81 is formed to expose the gate pad electrode 22. Although not shown, a pad open area is also formed to expose the data pad electrode.

As shown in FIG. 1G, a transparent conductive material of Indium Tin Oxide (ITO) or Indium Zinc Oxide (IZO), by way of example, is deposited on the entire surface of the substrate including the passivation layer 16, and is then patterned by photolithography using a fourth mask, to thereby form a pixel electrode 17 connected with the drain electrode 15b. Thus, the TFT array substrate is completed. At the same time, a transparent conductive layer 27 is formed to cover the pad open area, thereby preventing the gate and data pad electrodes from being oxidized.

Four exposure masks are required to form the TFT array substrate.

However, the related art TFT array substrate and the method for fabricating the same have the following disadvantages.

Forming the pattern of the TFT array substrate by the four diffraction exposure masks necessarily requires the process of patterning the data line layer and the semiconductor layer. A semiconductor tail is formed at the edge of the source/drain electrodes and data line, when defining the channel region by separating the source and drain electrodes from each other after ashing the photoresist having the step coverage. As shown in FIG. 2, the semiconductor tail 14a having a width of about 1.5 μm is formed at the edge of the data line 15, which causes the device to malfunction.

The semiconductor tail causes 'wavy noise' when turning on/off a backlight unit (B/L). The conductive properties of the semiconductor layer are changed based on the application of light. That is, if light is applied to the semiconductor layer, the semiconductor layer becomes conductive. If light is not applied to the semiconductor layer, the semiconductor layer becomes nonconductive.

If the backlight unit is turned off, a parasitic capacitance occurs between the data line 15 and the pixel electrode 17 owing to the semiconductor layer having no conductivity. Meanwhile, if the backlight unit is turned on, the semiconductor layer, which is more adjacent to the pixel electrode than the data line, becomes conductive whereby the parasitic capacitance occurs between the semiconductor layer 14 and the pixel electrode 17.

Because of the width of the semiconductor tail 14a, the data line 15 differs in size from the semiconductor layer 14. Thus, the parasitic capacitance generated between the data line 15 and the pixel electrode 17 is different from the parasitic capacitance generated between the semiconductor layer 14 and the pixel electrode 17. That is, the parasitic capacitance increases between the semiconductor layer and the pixel electrode because the semiconductor layer is substantially larger than the data line. Because parasitic capacitance changes as a function of the voltage-on/off state of the backlight unit, a wavy noise occurs on images.

Also, the pixel electrode 17 is at a predetermined distance from the data line 15 and the semiconductor layer 14 (about 5.0 and 3.5 μm, respectively). Thus, the pixel electrode 17 is further from the data line 15 by the width (about 1.5 μm) of the semiconductor tail 14a, whereby an open area decreases. Also, the area of a black matrix 90 is increased according to the semiconductor tail, wherein the black matrix 90 prevents light from leaking, so that the aperture ratio of the device is decreased.

Also, the turn-off current of the device increases due to the photocurrent generated by the semiconductor tail.

SUMMARY OF THE INVENTION

Accordingly, the present invention is directed to a TFT array substrate and a method for fabricating the same which substantially obviates one or more problems due to limitations and disadvantages of the related art.

An advantage of the present invention is to provide a four-mask process thin film transistor (TFT) array substrate and method for fabricating the same which prevents a semiconductor tail from being formed to thereby obtain a constant open area and to prevent wavy noise from occurring.

Additional features and advantages of the present invention will be set forth in the description which follows, and in part will be apparent from the description or may be learned from practice of the invention. These and other advantages of the invention will be realized and attained by the structure particularly pointed out in the written description and claims hereof as well as the appended drawings.

To achieve these and other advantages and in accordance with the purpose of the invention, as embodied and broadly described herein, a TFT array substrate includes a gate line and a gate electrode formed on a substrate; a gate insulation layer formed on the gate line and the gate electrode; a data line formed substantially perpendicular to the gate line to define a sub-pixel, and source and drain electrodes formed above the gate electrode; a semiconductor layer formed below the data line and the source and drain electrodes, wherein the semiconductor layer is formed in substantially the same pattern as those of the data line and the source and drain electrodes; a pixel electrode directly connected with the drain electrode without a contact hole; a passivation layer formed above the pixel electrode; a gate pad electrode formed at the end of the gate line as one body; and a data pad electrode formed at the end of the data line as one body.

In another aspect of the present invention, a method for fabricating a TFT array substrate includes forming a gate line, a gate electrode and a pad electrode on a substrate; sequentially depositing a gate insulation layer, a semiconductor layer and a metal layer on an entire surface of the substrate including the gate line; forming an open area in the pad electrode; forming a data line and source/drain electrodes by patterning the semiconductor layer and the metal layer; forming a pixel electrode connected with the drain electrode and a transparent conductive layer connected with the pad electrode by depositing and patterning a transparent conductive material on the entire surface of the substrate including the data line, and simultaneously defining a channel region by separating the source and drain electrodes from each other; and forming a passivation layer on the remaining surface of the substrate except the portion having the transparent conductive layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principle of the invention.

In the drawings.

DETAILED DESCRIPTION OF THE ILLUSTRATED EMBODIMENTS

Reference will now be made in detail to embodiments of the present invention, examples of which are illustrated in the accompanying drawings. Wherever possible, the same reference numbers will be used throughout the drawings to refer to the same or like parts.

Hereinafter, a TFT array substrate according to the present invention and a method for fabricating the same will be described with reference to the accompanying drawings.

First Embodiment

Figure 3:
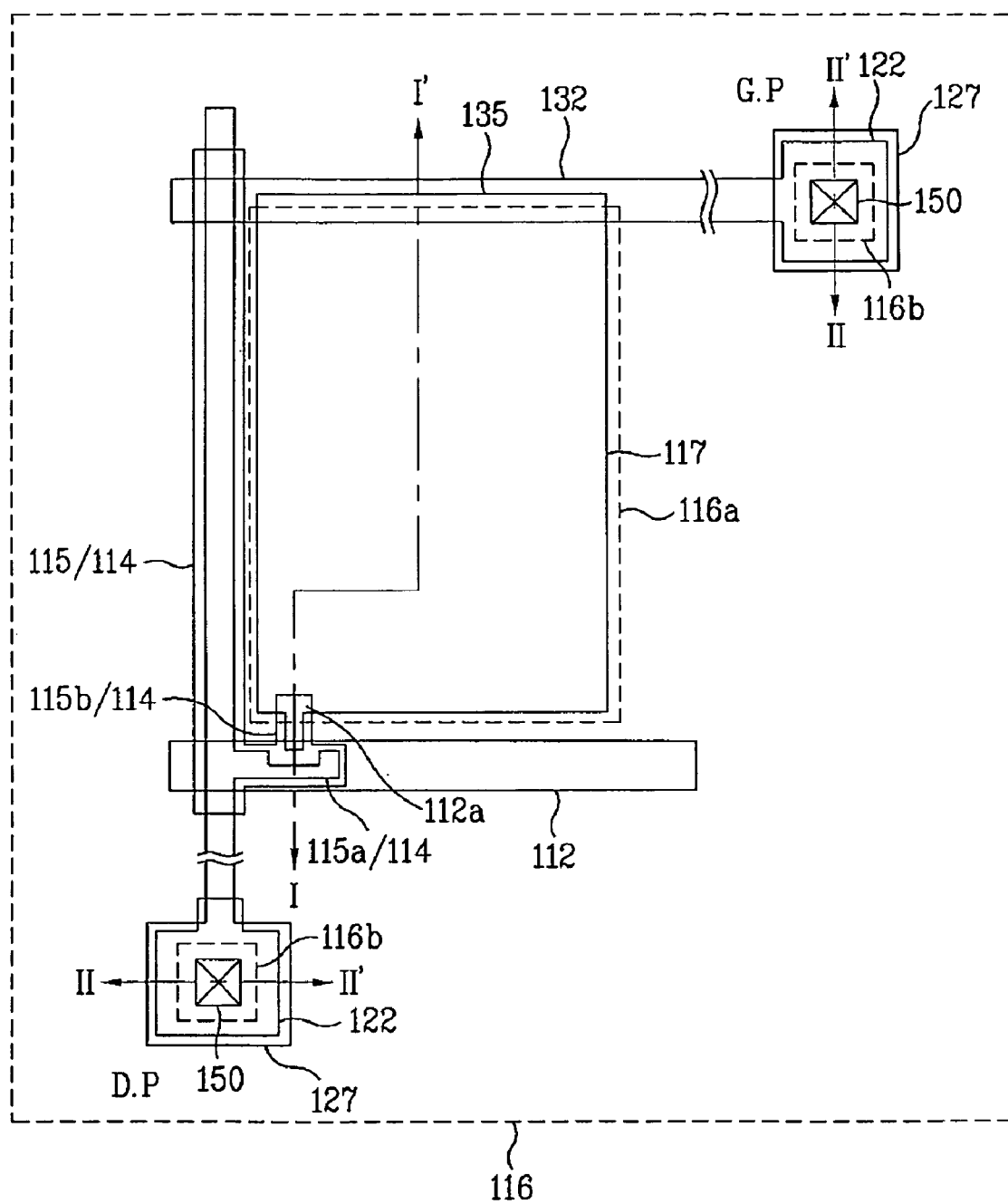
FIG. 3 is a plan view illustrating a TFT array substrate according to the first embodiment of the present invention.
Figure 4:
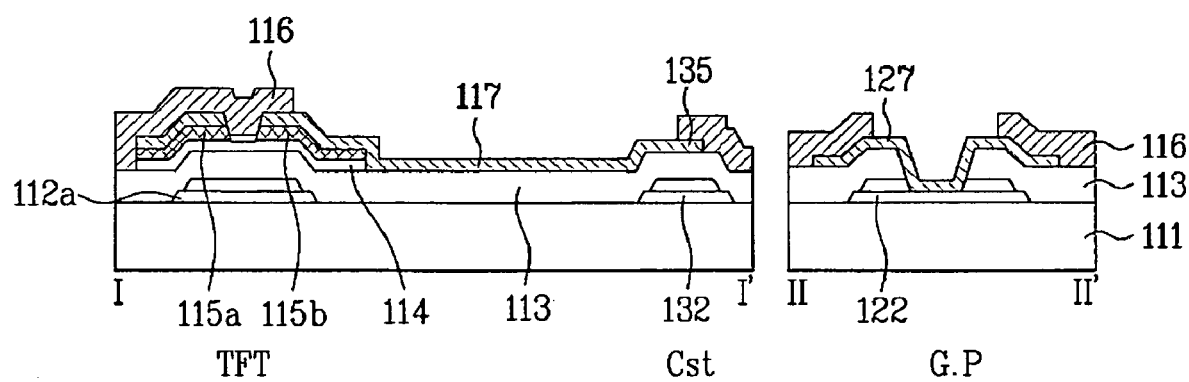
FIG. 4 is a cross sectional view illustrating a TFT array substrate according to the first embodiment of the present invention.
Figure 5:
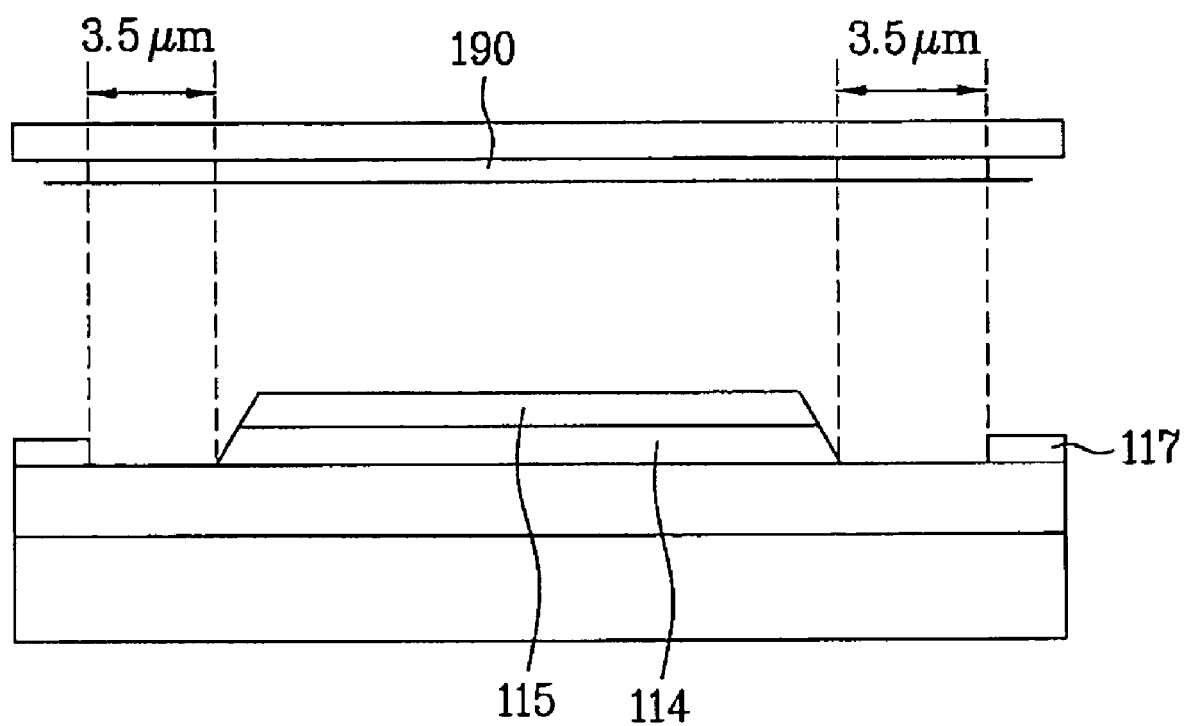
FIG. 5 is a cross sectional view illustrating an LCD device according to the present invention.

FIG. 3 is a plan view illustrating a TFT array substrate according to the first embodiment of the present invention. FIG. 4 is a cross sectional view illustrating a TFT array substrate according to the first embodiment of the present invention. FIG. 5 is a cross sectional view illustrating an LCD device according to the present invention. FIGS. 6A to 6K are cross sectional views illustrating a method for fabricating a TFT array substrate according to the first embodiment of the present invention.

The TFT array substrate of the LCD device according to the first embodiment of the present invention is for to a TN mode device. As shown in FIGS. 3 and 4, the TFT array substrate includes an active region with a pixel electrode 117 and a thin film transistor (TFT) and gate and data pad regions (G.P, D.P) with a pad electrode 122 connected with an external driving circuit (not shown).

The active region includes gate and data lines 112 and 1115 formed substantially perpendicular to one another to define a sub-pixel, a gate insulation layer 113 formed on an entire surface of a substrate corresponding to a portion between the gate and data lines 112 and 115, a thin film transistor (TFT) formed adjacent to a crossing portion of the gate and data lines 112 and 115, a pixel electrode 117 formed on an entire area inside the sub-pixel connected to a drain electrode 115b of the thin film transistor (TFT), and a passivation layer 116 formed on portions of the pixel electrode 117 except an open area of the sub-pixel. For reference, a dotted area provided above the pixel electrode corresponds to the portion formed by removing the passivation layer 116a from the open area of the sub-pixel.

The insulation layer is not formed between the pixel electrode 117 and a data line layer. Thus, the pixel electrode is connected with the drain electrode 115b without using a contact hole.

The thin film transistor (TFT) includes a gate electrode 112a, the gate insulation layer 113, a semiconductor layer 114, and source and drain electrodes 115a and 115b. A channel region of the semiconductor layer exposed between the source and drain electrodes is treated with oxygen plasma, thereby preventing the semiconductor layer from deteriorating. In addition, the passivation layer is formed in the channel region. At this time, a predetermined portion of the gate line 112 serves as the gate electrode 112a.

The semiconductor layer and the data line layer are fabricated by the same mask process. Thus, the semiconductor layer and the data line layer are formed in substantially the same pattern, wherein the semiconductor layer is provided below the data line and the source/drain electrodes.

At this time, a storage capacitor (Cst) is formed in the active region. The storage capacitor (Cst) includes a lower capacitor electrode 132 formed on the same layer as the gate line 112, an upper capacitor electrode 135 formed on the same layer as the pixel electrode 117 and overlapped with the lower capacitor electrode 132, and the gate insulation layer 113 formed between the lower and upper capacitor electrodes 132 and 135.

For one preferred embodiment, the lower capacitor electrode 132 may be formed of a predetermined portion of the gate line, and the upper capacitor electrode 135 may be formed by extending the pixel electrode to the gate line.

The pad region includes the gate pad electrode (G.P) and the data pad electrode (D.P). The gate pad electrode (G.P) is formed at the end of the gate line 112, wherein the gate pad electrode (G.P) transmits a scanning signal. The data pad electrode (D.P) is formed at the end of the data line 115, wherein the data pad electrode (D.P) transmits a video signal. The gate and data pad electrodes are covered with a transparent conductive layer 127, so that it may be possible to prevent the gate and data pad electrodes from being oxidized by external oxygen. In FIG. 3, the dotted area provided above the pad electrode 122 corresponds to the portion from which the passivation layer 116b is removed.

The transparent conductive layer 127 is electrically connected with the gate and data pad electrodes 122 through an open area 150. The open area 150 is formed by removing the gate insulation layer 113 from the portion between the transparent conductive layer and the pad electrode. Then, the passivation layer 116 is formed in the pad region except the portion including the transparent conductive layer 127.

The gate pad electrode (G.P) extends from the gate line 112, that is, the gate pad electrode (G.P) is formed as one body with the gate line 112. Also, the data pad electrode (D.P) is formed on the same layer as the gate line 112, whereby the transparent conductive layer provided above the data pad electrode is connected with the data line.

Figure 1A:
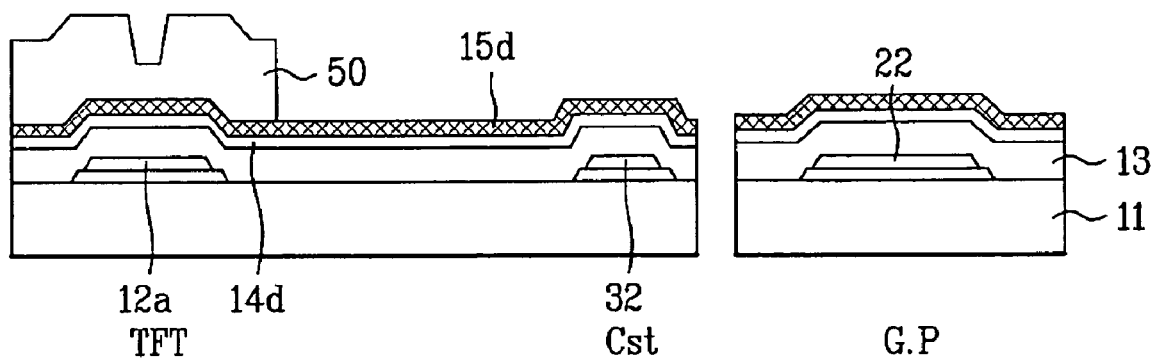
FIGS. 1A through 1G are cross sectional views illustrating a method for fabricating a related art TFT array substrate.
Figure 1B:
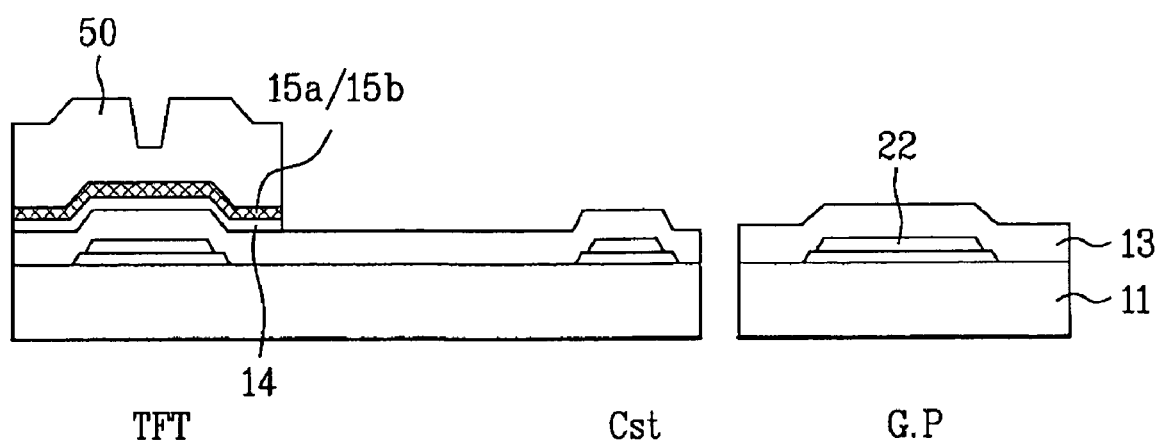
Figure 1C:
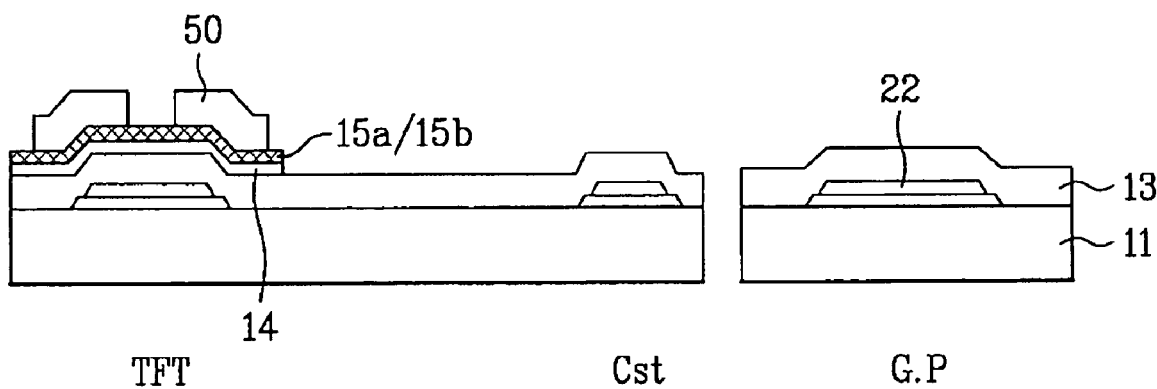
Figure 1D:
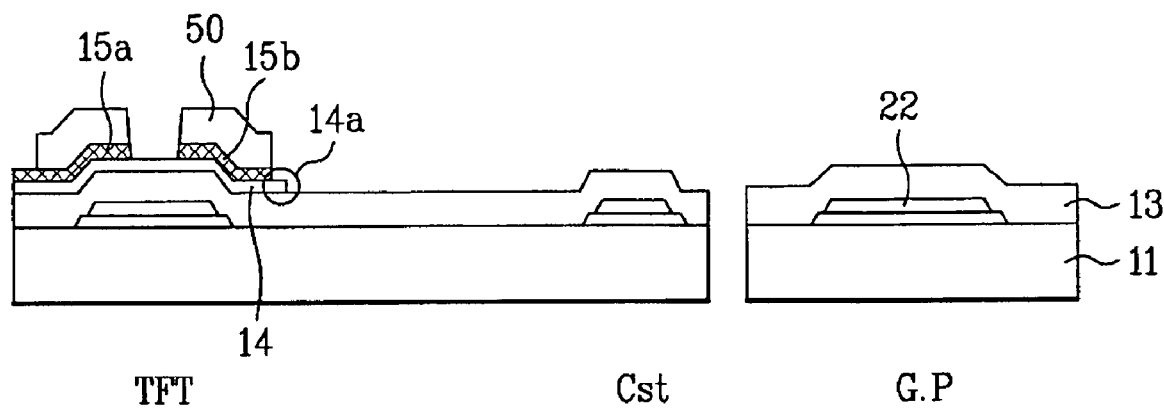
Figure 1E:
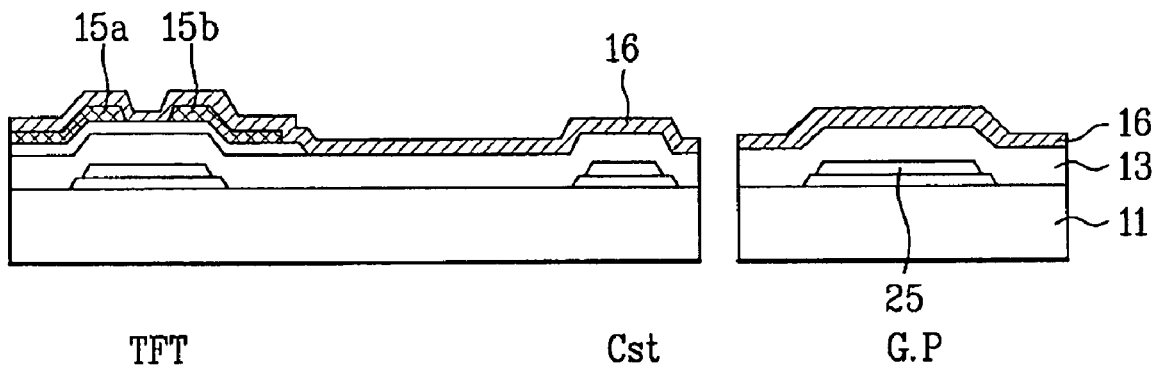
Figure 1F:
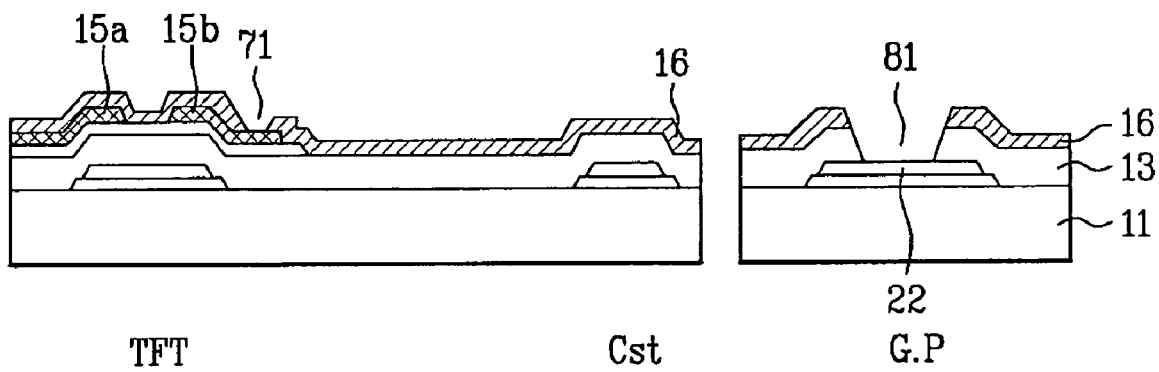
Figure 1G:
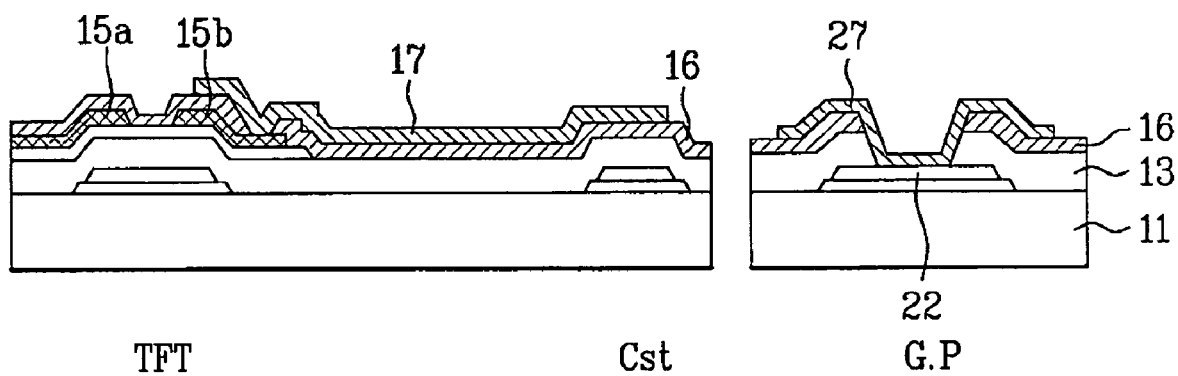
Figure 2:
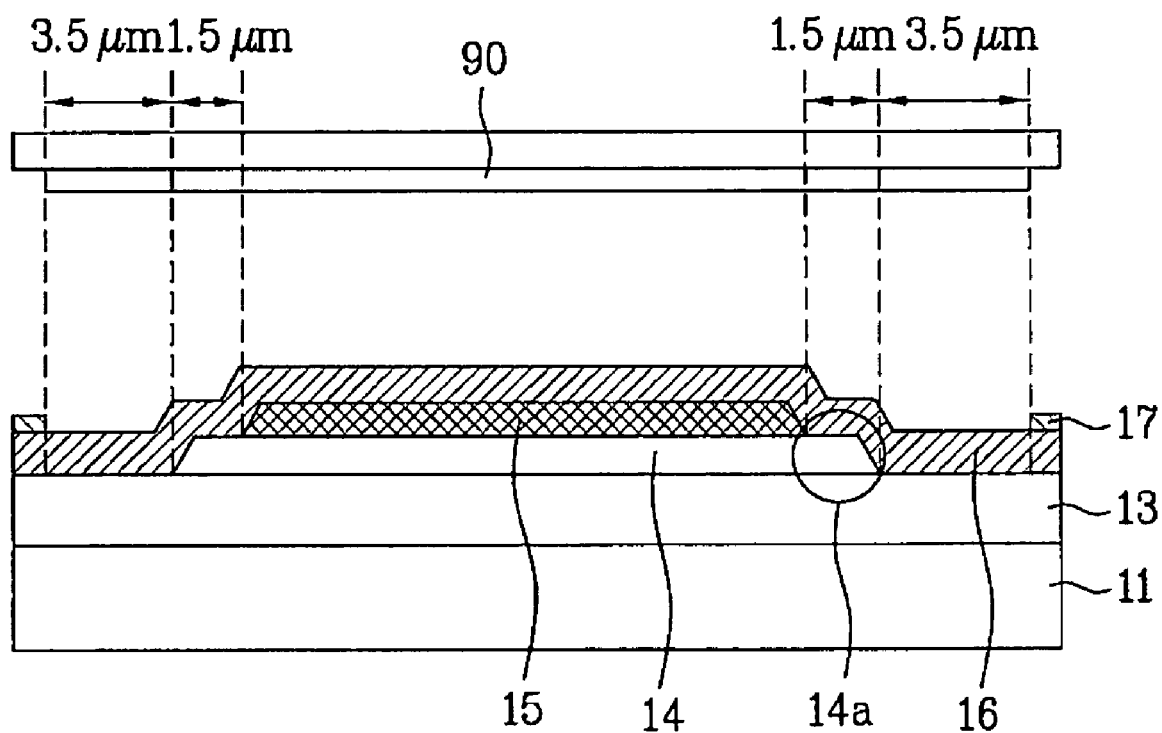
FIG. 2 is a cross sectional view illustrating defects of a related art TFT array substrate.

In the TFT array substrate, as shown in FIG. 5, the semiconductor layer 114 is not exposed to the outside of the data line 115, so that it may be possible to prevent the aperture ratio from being lowered by a portion (about 1.5 μm of FIG. 2) of a semiconductor tail. Thus, a black matrix (for preventing light leakage) decreases in size. For reference, a gap between the data line 115 and the pixel electrode 117 corresponds to about 3.5 μm, which may suffer light leakage. Accordingly, the black matrix is provided in the gap between the data line 115 and the pixel electrode 117, to thereby prevent light from leaking in the gap.

Although not shown, the TFT array substrate including the pixel electrode and the thin film transistor may be provided opposite to another substrate with a common electrode and a color filter layer. Then, the two substrates are bonded to each other, and a liquid crystal layer is formed between the two substrates, thereby completing the LCD device.

Figure 6A:
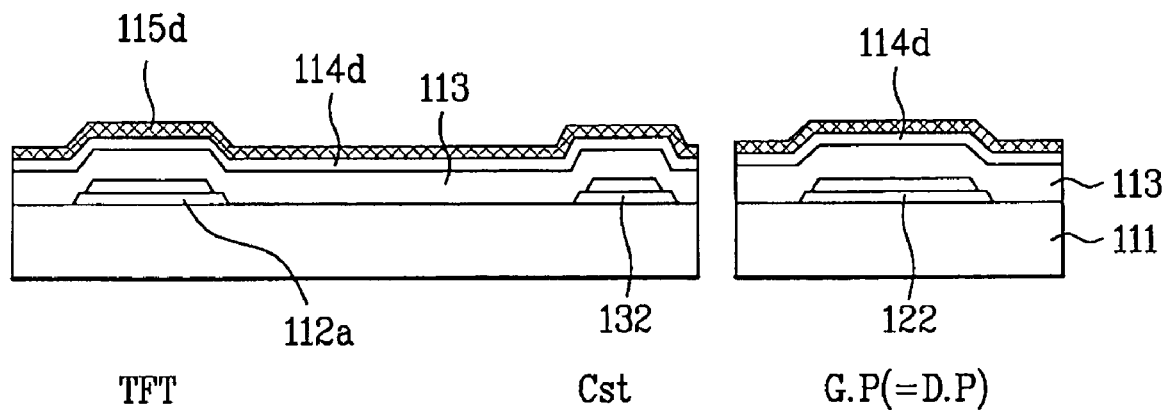
FIGS. 6A through 6K are cross sectional views illustrating a method for fabricating a TFT array substrate according to the first embodiment of the present invention.

To form the TFT array substrate of the LCD device, as shown in FIG. 6A, a metal layer is deposited by sputtering on the transparent substrate 111 having good heat-resistance and is then patterned by photolithography using a first exposure mask, thereby forming the gate line (112 of FIG. 3), the gate electrode 112a of the TFT, the lower capacitor electrode 132 of the storage capacitor region (Cst), the gate pad electrode 122 of the gate pad region (G.P), and the data pad electrode 122 of the data pad region (D.P). For example, the metal layer may be formed of copper (Cu), copper alloy (Cu alloy), aluminum (Al), aluminum neodymium (AlNd), molybdenum (Mo), molybdenum alloy (Mo alloy), chrome (Cr), chrome alloy (Cr alloy), titanium (Ti), titanium alloy (Ti alloy), silver (Ag), or silver alloy (Ag alloy). Preferably, the metal layer is formed of a deposition layer of Mo/AlNd.

The lower capacitor electrode 132 may be formed of a predetermined pattern that is separated in parallel from the gate line. In another aspect, a predetermined portion of the gate line serves as the lower capacitor electrode 132. The gate electrode 112a is formed as one body with the gate line, and the gate pad electrode 122 is formed as one body with the end of the gate line. The data pad electrode 122 is formed at the end of the data line that is fabricated by the following process.

An inorganic insulation layer of silicon nitride (SiNx) or silicon oxide (SiOx) is deposited on an entire surface of the substrate including the gate electrode 112a by CVD (Chemical Vapor Deposition) under high temperature conditions. After that, an amorphous silicon layer 114d is deposited on the inorganic insulation layer. Then, a metal layer 115d is deposited by sputtering, for example, copper (Cu), copper alloy (Cu alloy), aluminum (Al), aluminum neodymium (AlNd), molybdenum (Mo), molybdenum alloy (Mo alloy), chrome (Cr), chrome alloy (Cr alloy), titanium (Ti), titanium alloy (Ti alloy), silver (Ag), or silver alloy (Ag alloy). Preferably, the metal layer 115d is formed of molybdenum (Mo) by sputtering.

Figure 6B:
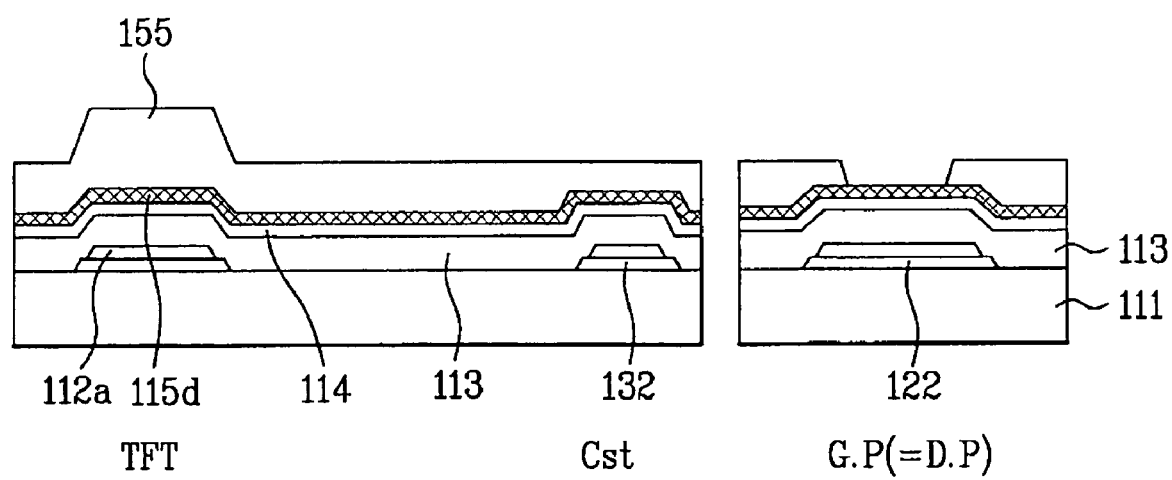

After that, as shown in FIG. 6B, a photoresist 155 of UV-curing resin is coated onto an entire surface of the metal layer 115d by a spinning method or a roll-coating method. After a second exposure mask (not shown) having a predetermined pattern is positioned substantially above the photoresist, the photoresist is exposed to UV or X-rays, and then the exposed photoresist is developed, thereby forming the photoresist pattern having the step coverage.

The second exposure mask is a diffraction exposure mask. To form the diffraction exposure mask, a light-shielding layer of a metal material and a semi-transparent layer are formed on a transparent substrate. The diffraction exposure mask may include three regions corresponding to a transparent region, a semi-transparent region, and a light-shielding region. The transparent region has light transmittance of 100%, the light-shielding region has light transmittance of 0%, and the semi-transparent region has light transmittance between about 0% and about 100%. After applying the diffraction exposure to the photoresist, the photoresist is divided into three regions: a first region corresponding to the transparent region of the diffraction exposure mask, wherein the photoresist is completely removed by development, a second region corresponding to the light-shielding region of the diffraction exposure mask, wherein the photoresist has a first thickness without being removed, and a third region corresponding to the semi-transparent region of the diffraction exposure mask, wherein the photoresist has a second thickness according as the photoresist is partially removed. Thus, the second thickness is substantially less than the first thickness. The photoresist may be a positive type or a negative type photoresist. For the positive type photoresist, if the predetermined portion of photoresist is exposed to light, it is removed. Meanwhile, for the negative type photoresist, if the predetermined portion of photoresist is not exposed to light, it is removed.

After the diffraction exposure process, the photoresist 155 has the step coverage. That is, the predetermined portions of the photoresist having the first thickness correspond to the data line and the TFT region of the source and drain electrodes. Also, the photoresist is completely removed above the gate pad electrode and the data pad electrode. Then, the other portions of the photoresist have a second thickness.

Figure 6C:
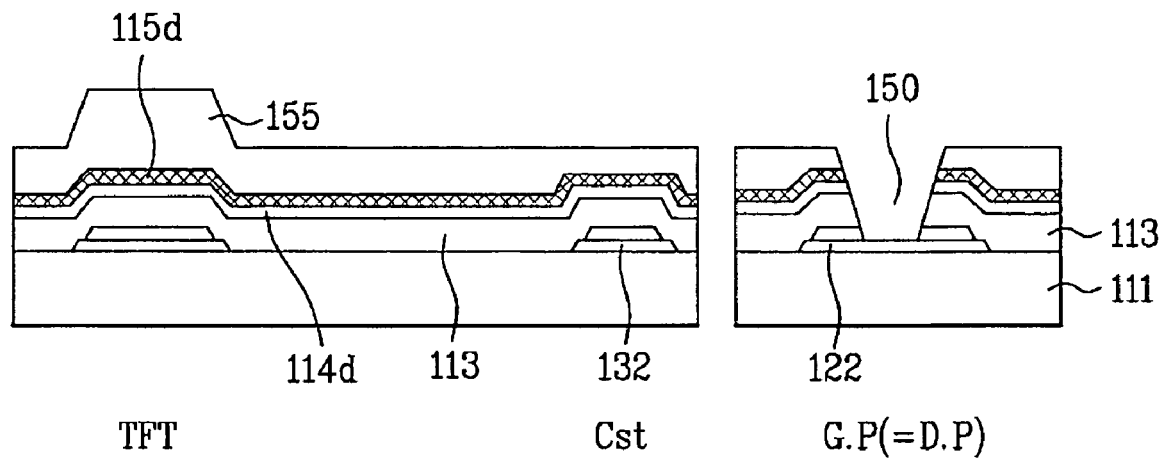

As shown in FIG. 6C, the metal layer 115d, the amorphous silicon layer 114d, and the gate insulation layer 113 are etched by the photoresist 155 as a mask, to hereby form the open area 150 above the gate and data pad electrodes. After the pad electrode 122 is formed of Mo/AlNd, the molybdenum (Mo) is removed from the pad electrode when forming the open area 150.

The process of etching the metal layer, the semiconductor layer, and the gate insulation layer above the gate and data pad electrodes 122 is comprised of a first step of etching the metal layer provided above the gate and data pad electrodes by a wet-etching method, and a second step of etching the semiconductor layer and the gate insulation layer provided above the gate and data pad electrodes by a dry-etching method. The wet-etching method uses a dipping or spraying technique with an etchant of $HNO_3/H_3PO_4/CH_3COOH/H_2O$. The dry-etching method uses plasma gas or radical.

The process of etching the metal layer, the semiconductor layer, and the gate insulation layer may be performed in one dry-etching chamber. In this case, the metal layer, the semiconductor layer, and the gate insulation layer are etched with different etching gases. If etching the metal material (Mo), $SF_6$, $Cl_2$ or $O_2$ may be used as the etching gas. If using amorphous silicon, $SF_6$, $Cl_2$ or $H_2$ may be used as the etching gas. If etching the gate insulation layer, $SF_6$, $O_2$ or He may be used as the etching gas.

Figure 6D:
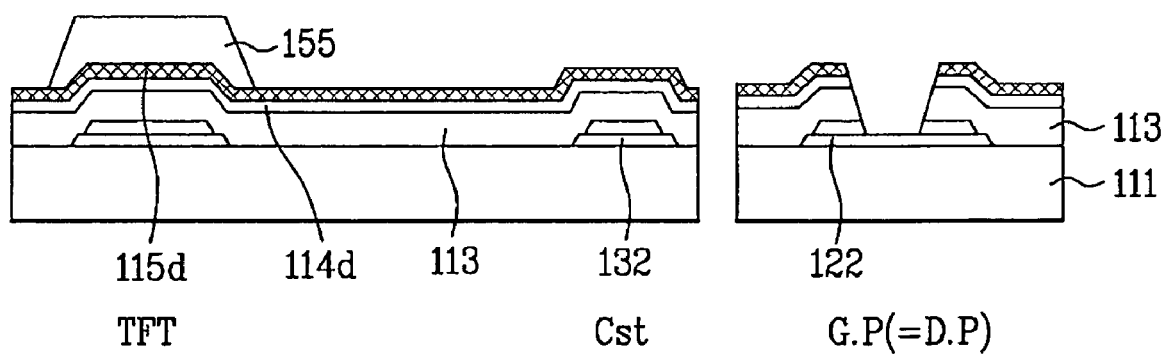
Figure 6E:
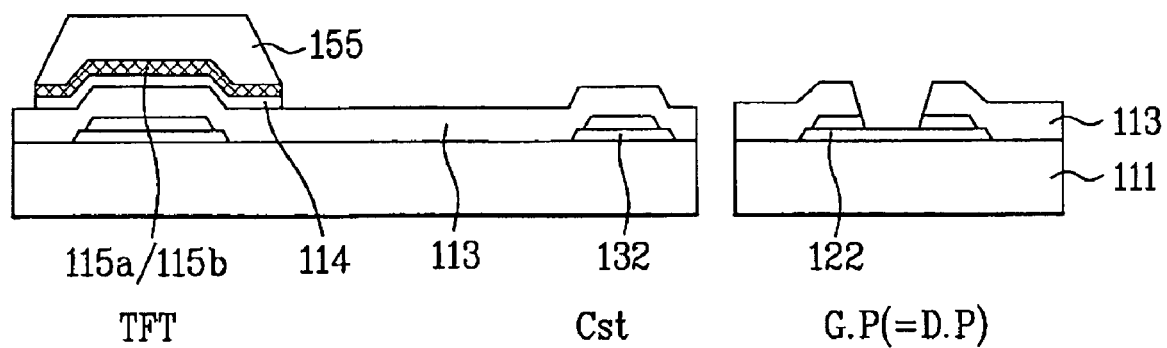

Then, as shown in FIG. 6D, the predetermined portion of the photoresist having the second thickness is completely removed by ashing the photoresist 155. As shown in FIG. 6E, the metal layer 115d and the amorphous silicon layer 114d are sequentially etched by using the photoresist 155 as a mask, thereby forming the data line (115 of FIG. 3), the source and drain electrodes 115a and 115b, and the semiconductor layer 114 below the source and drain electrodes. Because the data line layer and the semiconductor layer are fabricated by the same mask process, the pattern of the semiconductor layer is substantially the same as those of the data line and the source and drain electrodes, wherein the semiconductor layer is formed below the data line and the source/drain electrodes.

By one diffraction exposure process, it is possible to form the data line, the source and drain electrodes and the semiconductor layer 114 at the same time. The data line is formed substantially perpendicular to the gate line, whereby the sub-pixel is defined. Also, the semiconductor layer 114 and the source/drain electrodes 115a/115b are sequentially formed on the gate electrode 112a, thereby completing the thin film transistor (TFT).

Figure 6F:
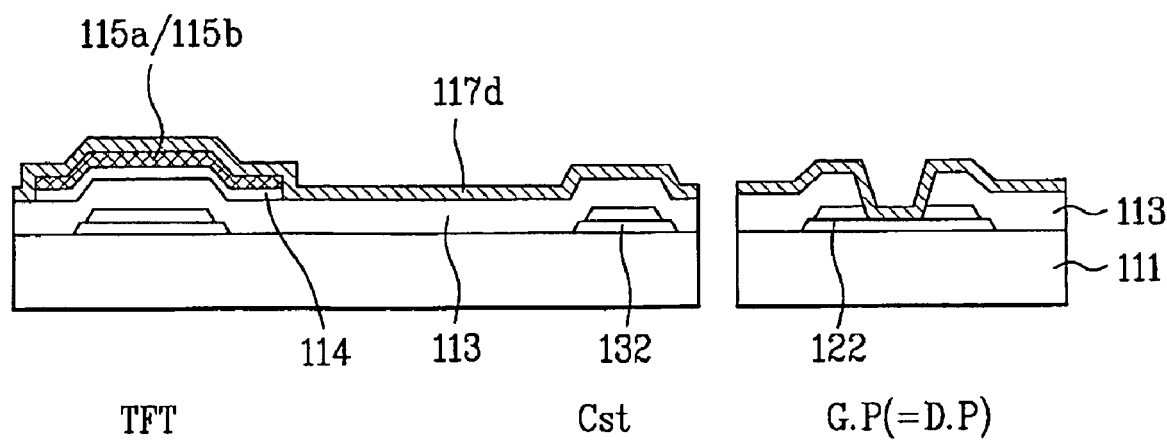
Figure 6G:
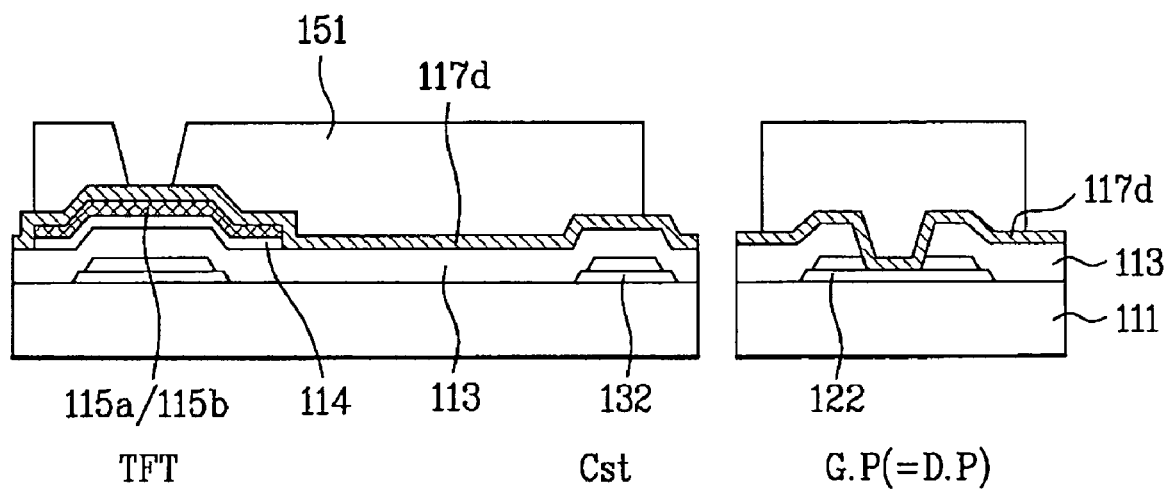

As shown in FIG. 6F, after removing the photoresist 155, a transparent conductive layer 117d is deposited on the entire surface of the substrate including the source and drain electrodes 115a and 115b, wherein the transparent conductive layer 117d is formed of Indium Tin Oxide (ITO) or Indium Zinc Oxide (IZO). After that, as shown in FIG. 6G, a photoresist 151 is coated onto the transparent conductive layer 117d, and is then patterned by photolithography using a third exposure mask.

Figure 6H:
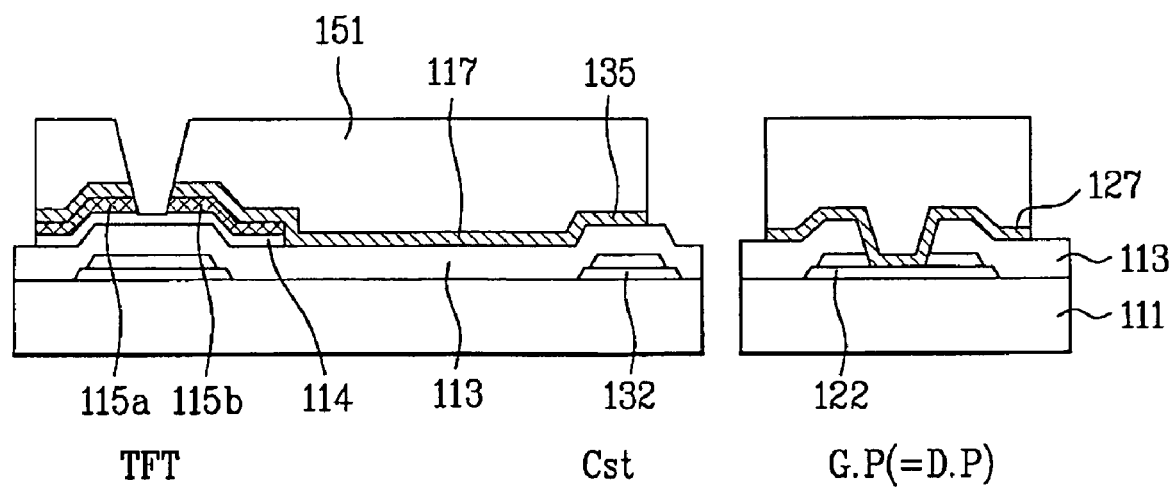

As shown in FIG. 6H, the transparent conductive layer 117d is etched by using the photoresist 151 as a mask, thereby forming the pixel electrode 117, the upper capacitor electrode 135, and the transparent conductive layer 127. Then, the channel region of the thin film transistor is defined by etching the space between the source and drain electrodes 115a and 115b. When wet-etching the space between the source and drain electrodes 115a and 115b, an etchant of Hydrofluoric Acid (HF), Buffered Oxide Etchant (BOE), $NJ_4F$, or a mixed solution thereof may be used. An etchant which can etch ITO is available for the etching of molybdenum (Mo).

The steps of defining the channel region and forming the pixel electrode are performed at the same time, whereby it is possible to prevent a semiconductor tail from being formed in the channel region.

The pixel electrode 117 is formed in the entire area of the sub-pixel. The pixel electrode 117 is directly connected with the drain electrode 115b without a contact hole. Also, the upper capacitor electrode 135 extends from the pixel electrode, that is, the upper capacitor electrode 135 is formed as one body with the pixel electrode.

The transparent conductive layer 127 covers the gate pad electrode 122 and the data pad electrode 122, so that it is possible to prevent the gate and data pad electrodes from being oxidized. The transparent conductive layer positioned above the data pad electrode extends to the data line of the active region, whereby the transparent conductive layer is electrically connected with the data line.

Figure 6I:
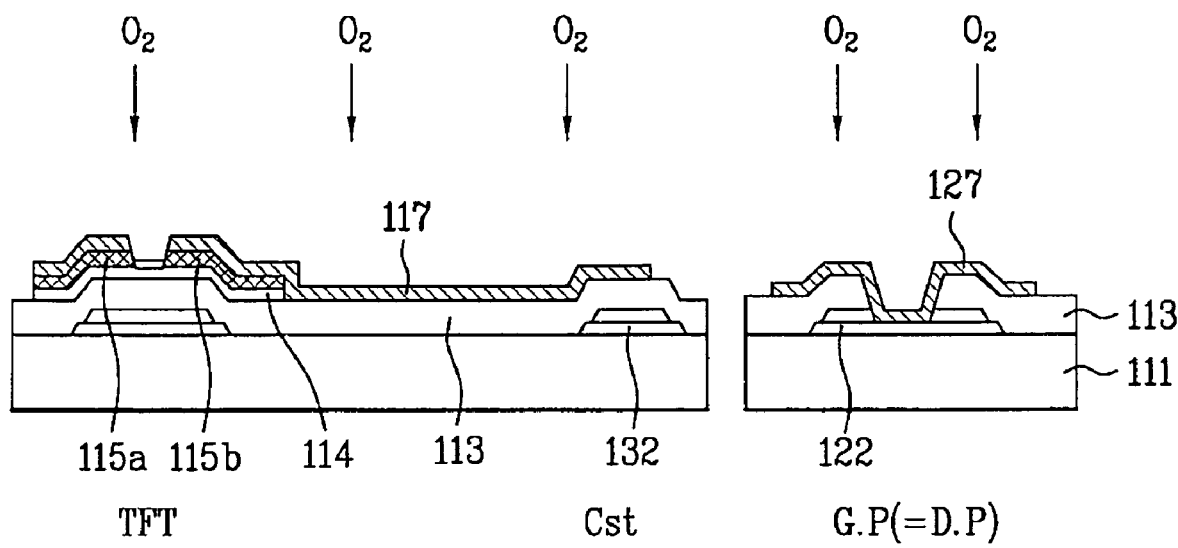

The upper capacitor electrode 135 is overlapped with the lower capacitor electrode 132 with the gate insulation layer therebetween, thereby completing the storage capacitor (Cst). Then, after removing the photoresist 151, as shown in FIG. 6I, $n^+$-type impurity ions are implanted to the channel region of the semiconductor layer 114 exposed between the source and drain electrodes 115a and 115b, and then are treated with $O_2$ plasma, thereby preventing the semiconductor layer from deteriorating due to ambient light.

Figure 6J:
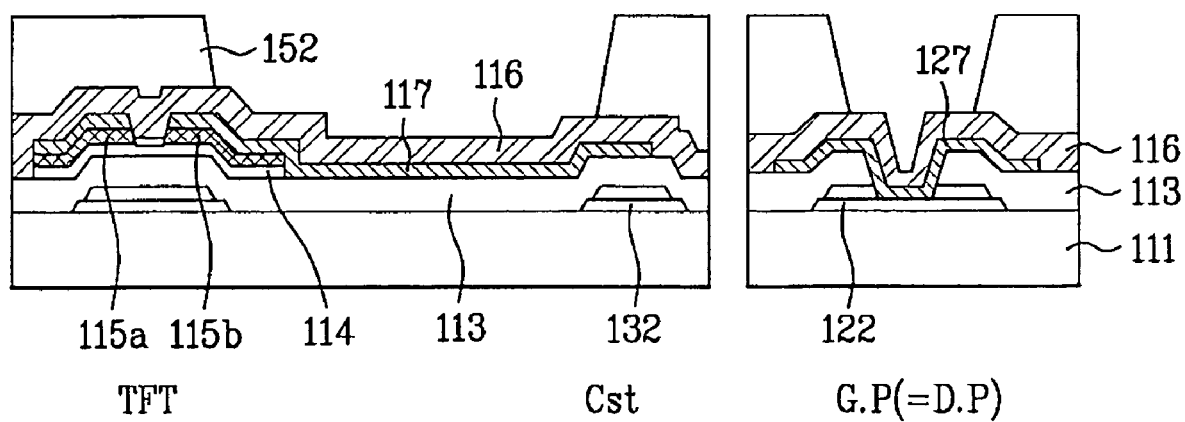

As shown in FIG. 6J, an inorganic insulation layer of silicon oxide ($SiO_2$) or silicon nitride (SiNx) is formed on the entire surface of the substrate including the pixel electrode 117, wherein the inorganic insulation layer is formed at a thickness of about 1000 Angstroms or less, thereby forming the passivation layer 116. Then, the photoresist 152 is coated onto the passivation layer 116, and is then patterned by photolithography using a fourth mask. Then, the passivation layer exposed by the photoresist is etched. The passivation layer is formed in the channel region between the source and drain electrodes.

Figure 6K:
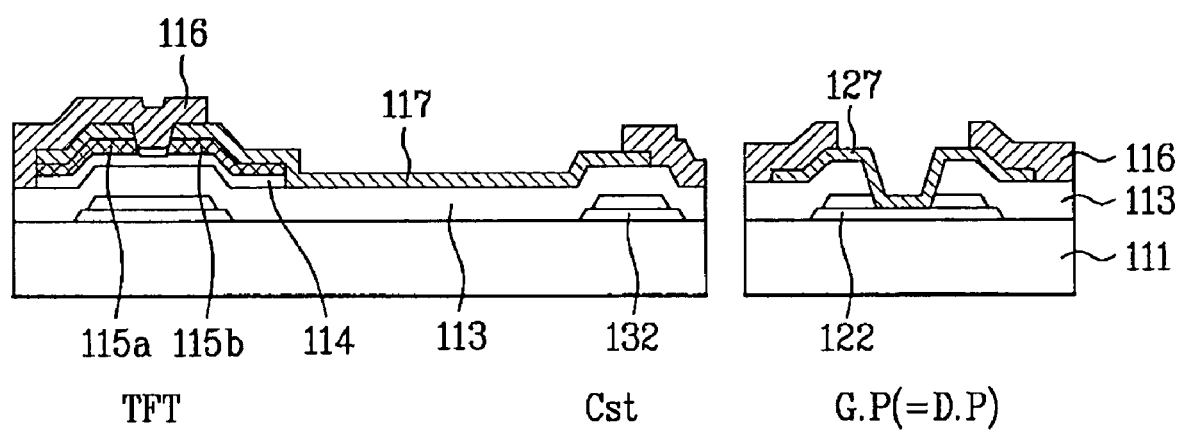

After removing the photoresist, as shown in FIG. 6K, the passivation layer 116 is left in the remaining regions except the portion of the open area of the sub-pixel and the pad electrode (or transparent conductive layer). That is, an image is displayed through the open area of the sub-pixel from which the passivation layer is removed. Also, the pad electrode is electrically connected with an external driving circuit through the transparent conductive layer from which the passivation layer is removed.

The TFT array substrate according to the first embodiment of the present invention is fabricated by four exposure masks that is appropriate for low-mask technology. Because the amorphous silicon layer and the metal layer are etched at the same time, it is possible to prevent a semiconductor tail from being formed as the result of over-etching of the metal layer. As a result, aperture ratio is improved by removing the passivation layer from the sub-pixel.

Second, Third and Fourth Embodiments

The first embodiment of the present invention focused on a TN mode LCD device. However, the present invention may be applicable to a TFT array substrate of an IPS mode LCD device which will be explained as follows.

Figure 7:
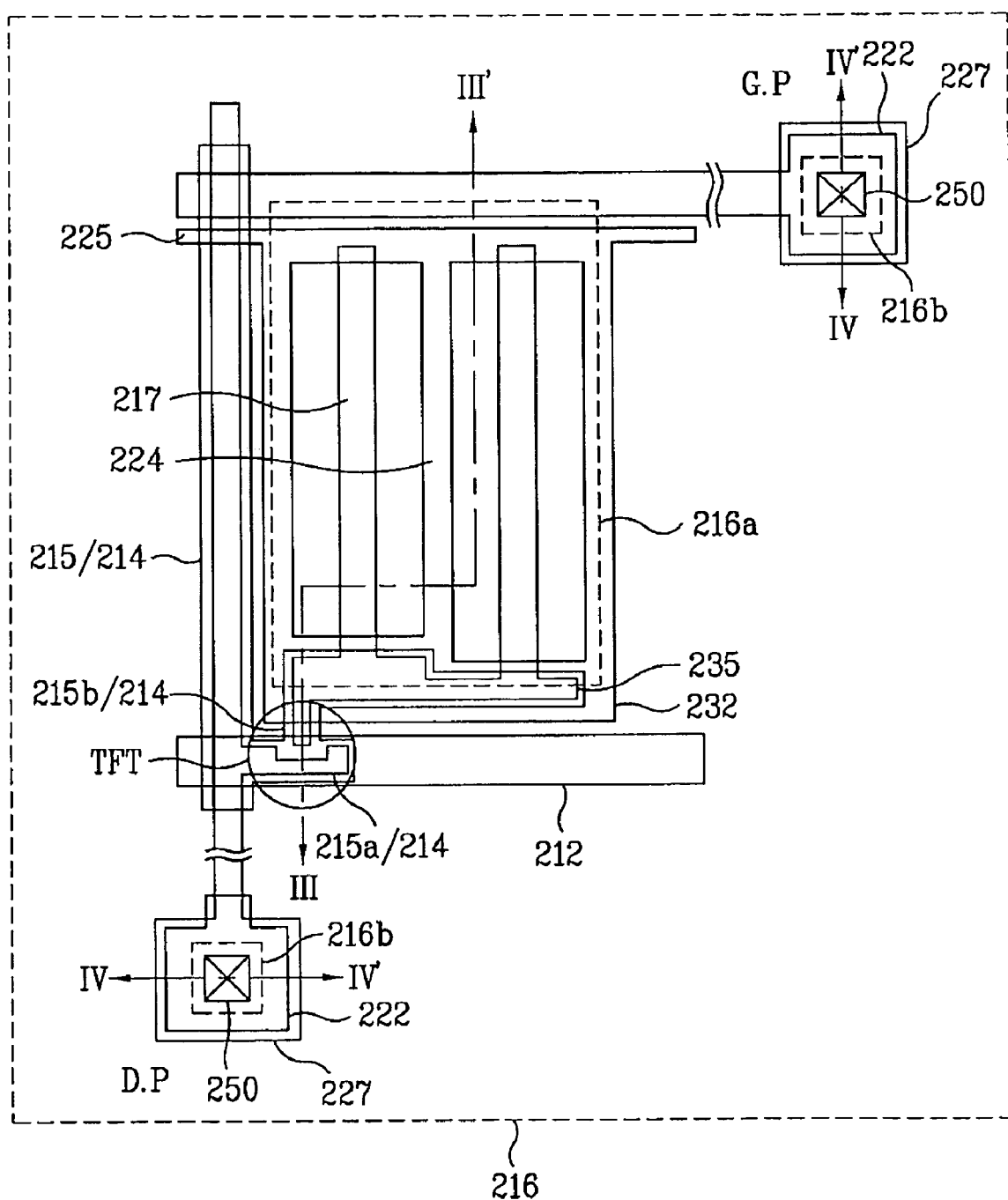
FIG. 7 is a plan view illustrating a TFT array substrate according to the second embodiment of the present invention.
Figure 8:
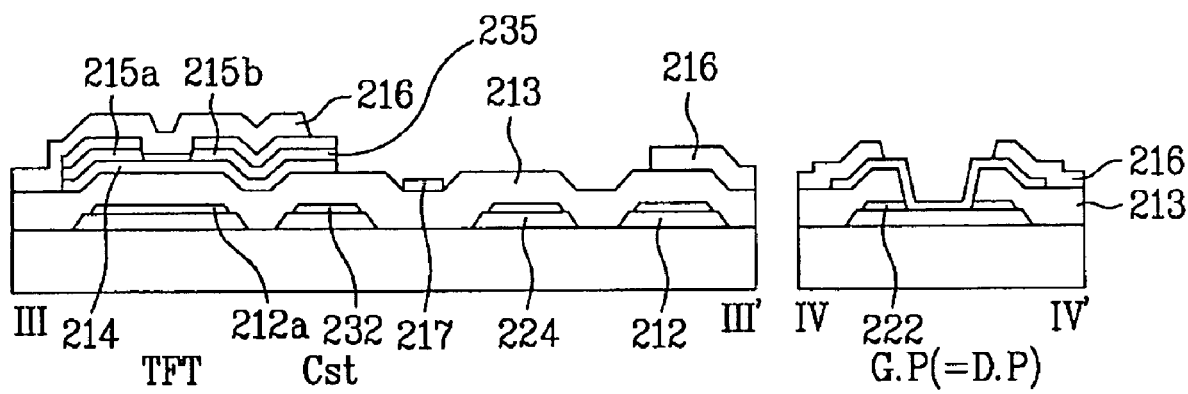
FIG. 8 is a cross sectional view illustrating a TFT array substrate according to the second embodiment of the present invention.

FIG. 7 is a plan view illustrating a TFT array substrate according to the second embodiment of the present invention. FIG. 8 is a cross sectional view illustrating a TFT array substrate according to the second embodiment of the present invention. FIGS. 9A to 9D are plan views illustrating a TFT array substrate according to the second embodiment of the present invention. FIGS. 10A to 10K are cross sectional views illustrating a method for fabricating a TFT array substrate according to the second embodiment of the present invention.

Figure 11:
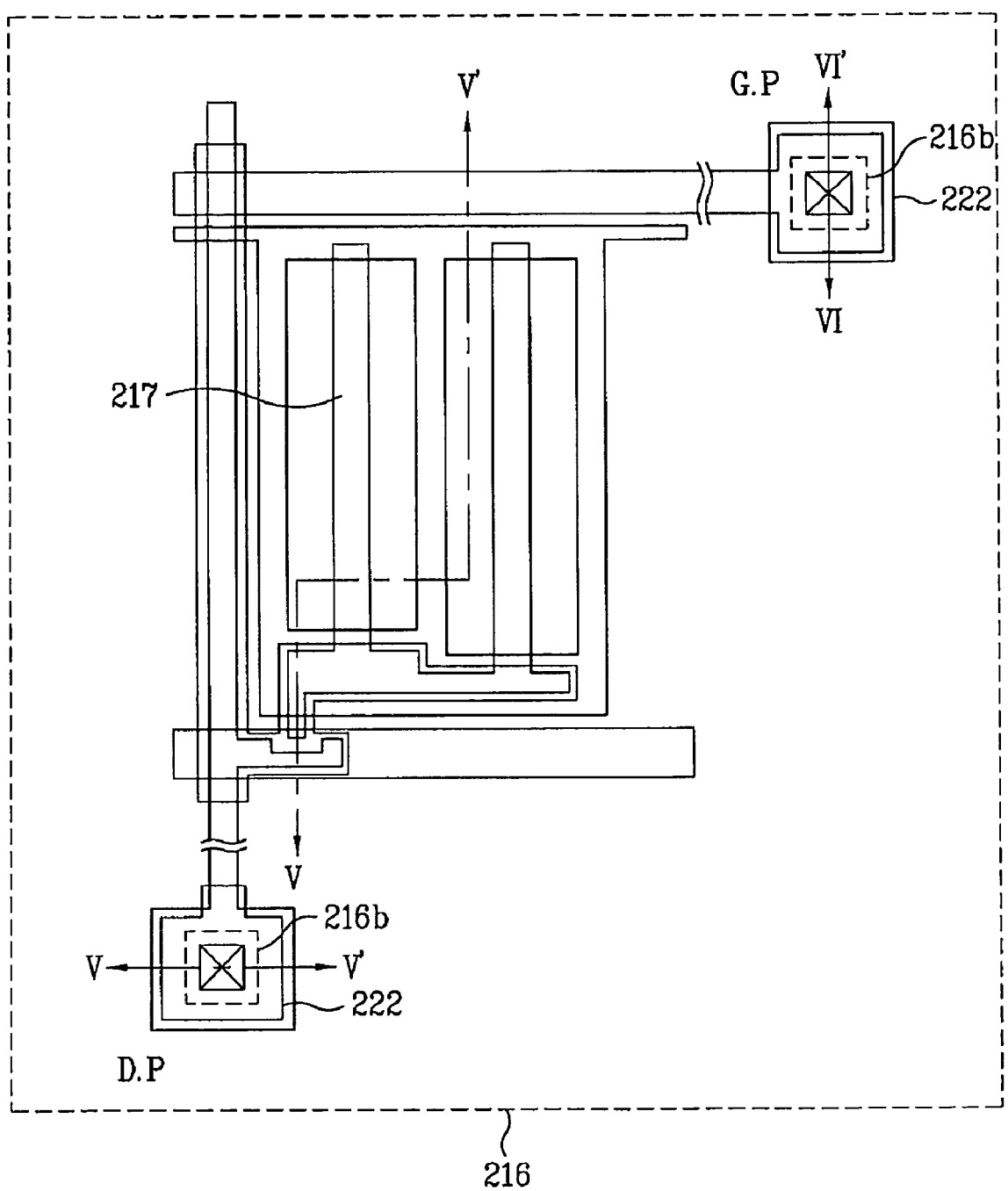
FIG. 11 is a plan view illustrating a TFT array substrate according to the third embodiment of the present invention.
Figure 12:
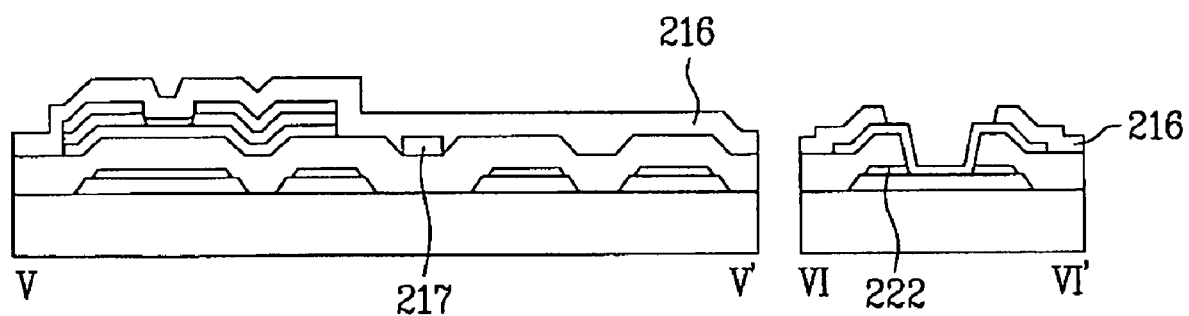
FIG. 12 is a cross sectional view illustrating a TFT array substrate according to the third embodiment of the present invention.
Figure 13:
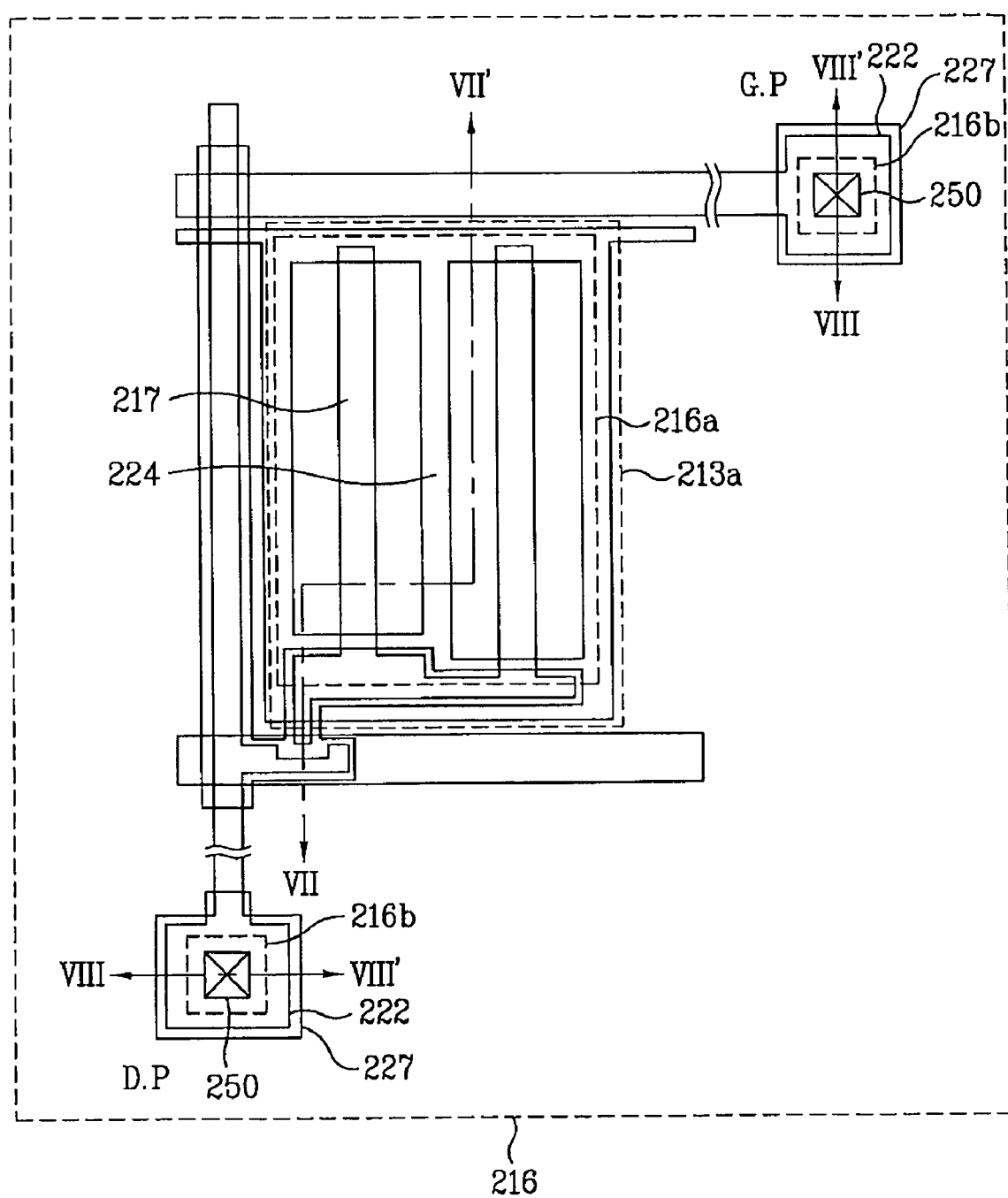
FIG. 13 is a plan view illustrating a TFT array substrate according to the fourth embodiment of the present invention.
Figure 14:
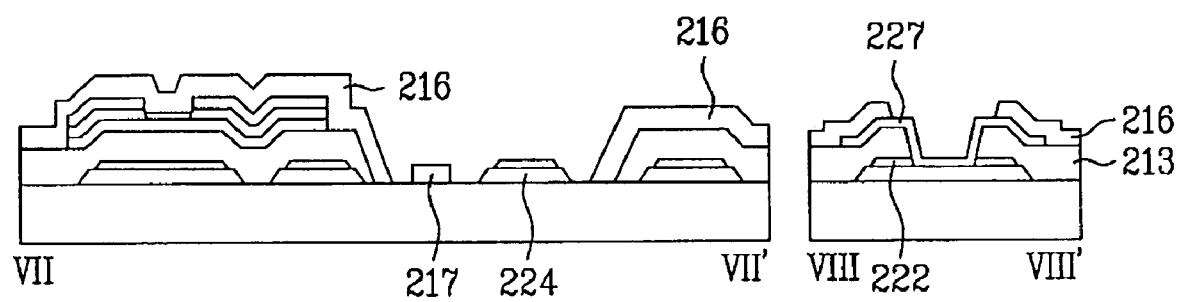
FIG. 14 is a cross sectional view illustrating a TFT array substrate according to the fourth embodiment of the present invention.

FIG. 11 is a plan view illustrating a TFT array substrate according to the third embodiment of the present invention. FIG. 12 is a cross sectional view illustrating a TFT array substrate according to the third embodiment of the present invention. FIG. 13 is a plan view illustrating a TFT array substrate according to the fourth embodiment of the present invention. FIG. 14 is a cross sectional view illustrating a TFT array substrate according to the fourth embodiment of the present invention.

As shown in FIGS. 7 and 8, the TFT array substrate of the IPS mode LCD device includes an active region with a common electrode 224, a pixel electrode 217 and a thin film transistor (TFT), and gate and data pad regions (G.P, D.P) with a pad electrode 222 connected with an external driving circuit (not shown).

The active region includes gate and data lines 212 and 215 formed substantially perpendicular to one another to define a sub-pixel, a gate insulation layer 213 formed on an entire surface of a substrate corresponding to a portion between the gate and data lines, a thin film transistor (TFT) formed adjacent to a crossing portion of the gate and data lines 212 and 215, a pixel electrode 217 overlapped with a drain electrode 215b of the thin film transistor (TFT), a common line 225 that transmits a Vcom signal, the common line formed in parallel to the gate line 212, a common electrode 224 that diverges from the common line 225 and is formed in parallel to the pixel electrode 217 to generate a horizontal electric field, and a passivation layer 216 formed on portions of the pixel electrode 217 except an open area of the sub-pixel.

The pixel electrode 217 is formed directly on a data line layer without forming an insulation layer, whereby the pixel electrode 217 is electrically connected with a drain electrode without a contact hole. Also, a thin gate insulation layer 213 is interposed between the pixel electrode 217 and the common electrode 224, thereby improving the intensity of the horizontal electric field.

The thin film transistor (TFT) is comprised of a gate electrode 212a, the gate insulation layer 213, a semiconductor layer 214, and source and drain electrodes 215a and 215b. A channel region of the semiconductor layer exposed between the source and drain electrodes is treated with oxygen plasma, thereby preventing the semiconductor layer from deteriorating by the application of ambient light. In addition, the passivation layer is formed in the channel region. A predetermined portion of the gate line 212 serves as the gate electrode 212a.

To decrease the number of masks used, the semiconductor layer and the data line layer are fabricated by the same mask process, whereby they are formed in substantially the same pattern. In this case, the semiconductor layer is provided below the data line and the source/drain electrodes.

A storage capacitor (Cst) is formed in the active region. The storage capacitor (Cst) includes a lower capacitor electrode 132 formed on the same layer as the gate line 112, an upper capacitor electrode 135 formed on the same layer as the pixel electrode 117 and overlapped with the lower capacitor electrode 132, and the gate insulation layer 113 formed between the lower and upper capacitor electrodes 132 and 135.

The pad region includes the gate pad electrode (G.P) and the data pad electrode (D.P). The gate pad electrode (G.P) is formed at the end of the gate line 212, wherein the gate pad electrode (G.P) transmits a scanning signal. The data pad electrode (D.P) is formed at the end of the data line 215, wherein the data pad electrode (D.P) transmits a video signal. The gate and data pad electrodes are covered with a transparent conductive layer 227 (FIG. 7), so that it is possible to prevent the gate and data pad electrodes from being oxidized by external oxygen.

The transparent conductive layer 227 is electrically connected with the gate and data pad electrodes 222 through an open area 250. The open area 250 is formed by removing the gate insulation layer 213 between the transparent conductive layer and the pad electrode. Then, the passivation layer 216 is formed in the pad region except the portion including the transparent conductive layer 227.

The gate pad electrode (G.P) extends from the gate line 212, that is, the gate pad electrode (G.P) is formed as one body with the gate line 212. Also, the data pad electrode (D.P) is formed on the same layer as the gate line 212, whereby the transparent conductive layer provided above the data pad electrode is connected with the data line.

In the TFT array substrate, as shown in FIG. 5, the semiconductor layer 114 is not exposed to the outside of the data line 115, so that it is possible to prevent aperture ratio from being lowered by a portion (about 1.5 µm of FIG. 2) of a semiconductor tail. Thus, a black matrix for preventing light leakage decreases in size. For reference, a gap between the data line 115 and the pixel electrode 117 corresponds to about 3.5 µm, which may suffer light leakage. Accordingly, the black matrix is provided in the gap between the data line 115 and the pixel electrode 117, to thereby prevent light from leaking in the gap.

In the TFT array substrate, the semiconductor layer 214 is not exposed to the outside of the data line 215, so that it is possible to prevent aperture ratio from being lowered by a portion of a semiconductor tail.

Although not shown, the TFT array substrate including the common electrode, the pixel electrode and the thin film transistor may be provided opposite to another substrate provided with a color filter layer. Then, the two substrates are bonded to each other, and a liquid crystal layer is formed between the two substrates, thereby completing the LCD device.

Figure 9A:
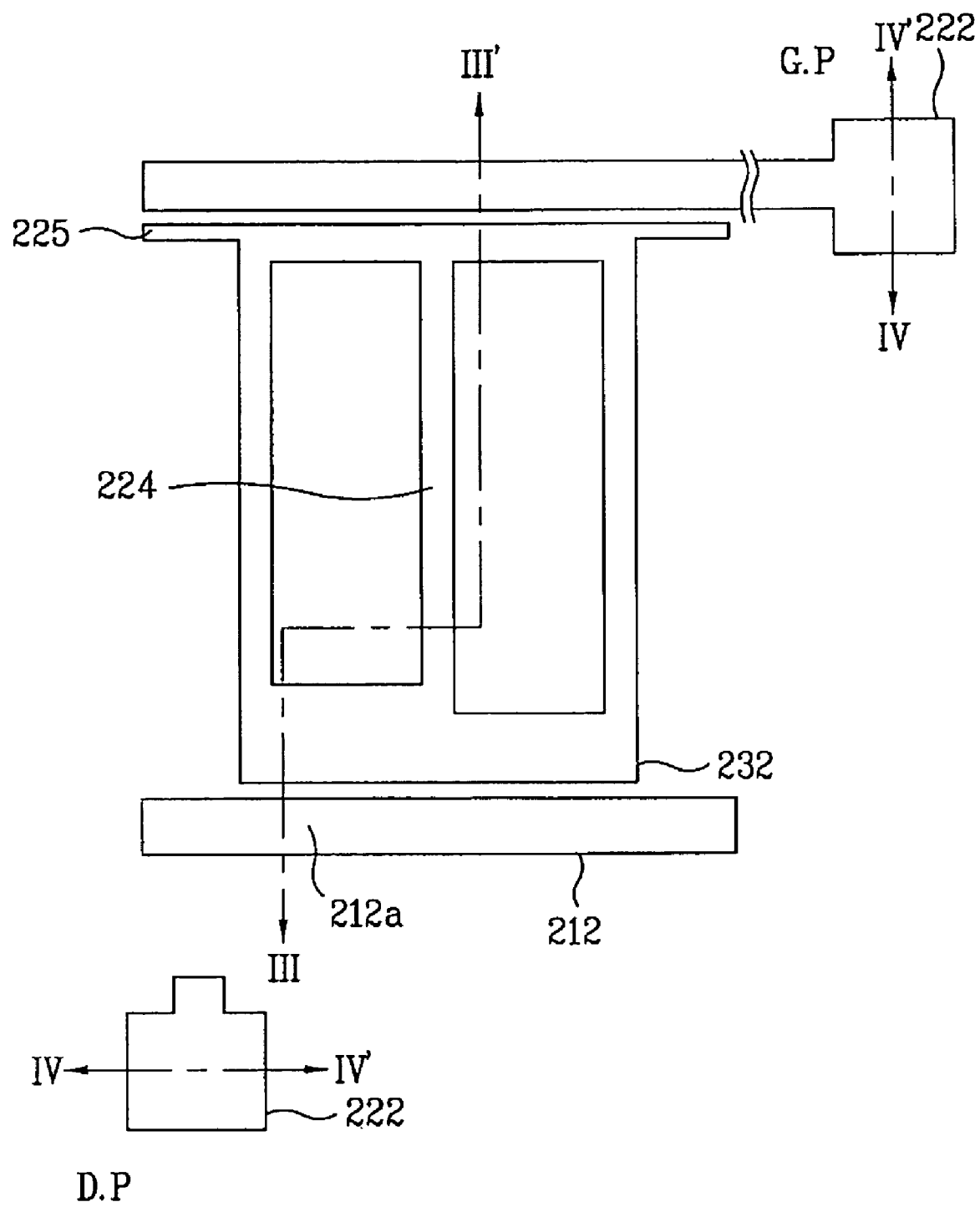
FIGS. 9A through 9D are plan views illustrating a TFT array substrate according to the second embodiment of the present invention.
Figure 10A:
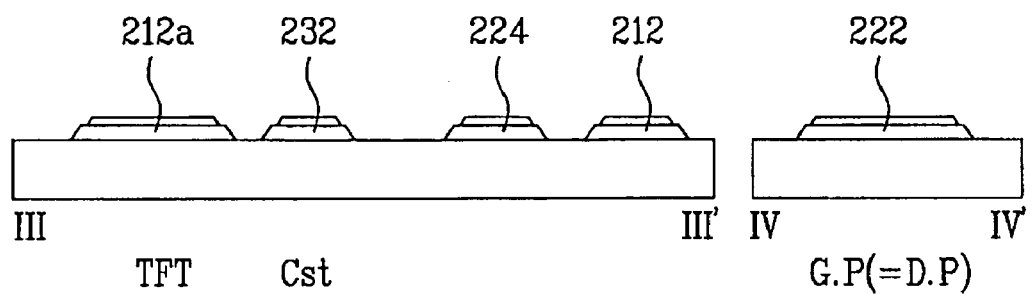
FIGS. 10A through 10K are cross sectional views illustrating a method for fabricating a TFT array substrate according to the second embodiment of the present invention.

To form the TFT array substrate of the IPS mode LCD device, as shown in FIGS. 9A and 10A, a metal layer is deposited by sputtering on a transparent substrate having good heat-resistance and is then patterned by photolithography using a first exposure mask, thereby forming the gate line 212, the common line 225, the common electrode 224, the gate electrode 212a of the TFT, the lower capacitor electrode 232 of the storage capacitor region (Cst), the gate pad electrode 222 of the gate pad region (G.P), and the data pad electrode 222 of the data pad region (D.P).

For example, the metal layer may be formed of copper (Cu), copper alloy (Cu alloy), aluminum (Al), aluminum neodymium (AlNd), molybdenum (Mo), molybdenum alloy (Mo alloy), chrome (Cr), chrome alloy (Cr alloy), titanium (Ti), titanium alloy (Ti alloy), silver (Ag), or silver alloy (Ag alloy). Preferably, the metal layer is formed of a deposition layer of Mo/AlNd. The common line 225 is formed substantially in parallel to the gate line 212, and the common electrode 224 diverges from the common line 225.

The lower capacitor electrode 232 is formed as one body with the common line 225 and the common electrode 224. The gate electrode 212a is formed of a predetermined portion of the gate line 212. Also, the gate pad electrode 222 is formed at the end of the gate line 212, that is, the gate pad electrode 222 is formed as one body with the gate line 212. The data pad electrode 222 is formed at the end of the data line which is formed by the following process.

Figure 10B:
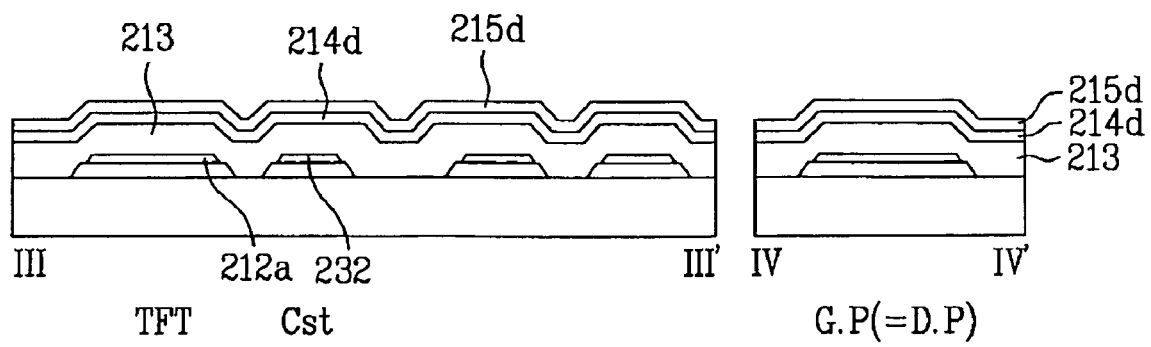

As shown in FIG. 10B, an inorganic insulation layer of silicon nitride (SiNx) or silicon oxide (SiOx) is deposited on an entire surface of the substrate including the gate electrode 212a by CVD (Chemical Vapor Deposition) under high temperature conditions. After that, an amorphous silicon layer 214d is deposited on the inorganic insulation layer. Then, a metal layer 215d is deposited by sputtering, for example, copper (Cu), copper alloy (Cu alloy), aluminum (Al), aluminum neodymium (AlNd), molybdenum (Mo), molybdenum alloy (Mo alloy), chrome (Cr), chrome alloy (Cr alloy), titanium (Ti), titanium alloy (Ti alloy), silver (Ag), or silver alloy (Ag alloy). Preferably, the metal layer 215d is formed of molybdenum (Mo).

Figure 10C:
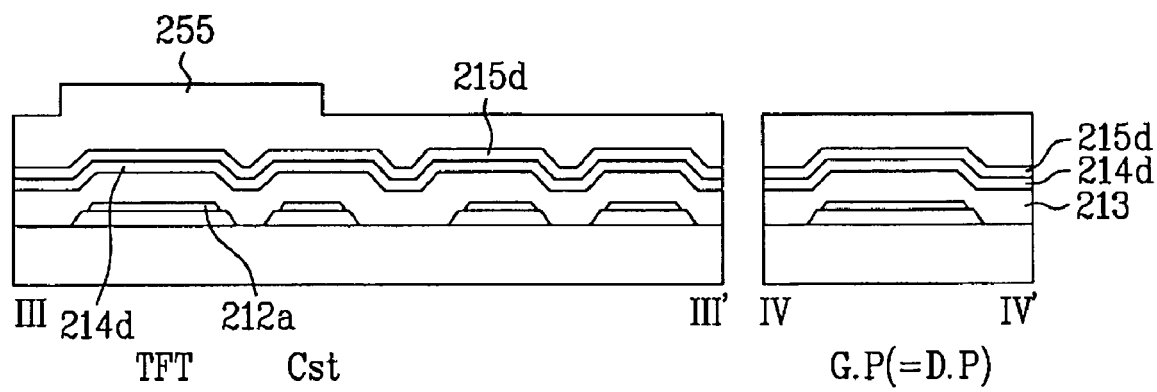

As shown in FIG. 10C, a photoresist 255 of UV-curing resin is coated onto an entire surface of the metal layer 215d by a spinning method or a roll-coating method. After a second exposure mask (not shown) having a predetermined pattern is positioned substantially above the photoresist, the photoresist is exposed to UV or X-rays, and then the exposed photoresist is developed, thereby forming the photoresist pattern having the step coverage.

The second exposure mask is a diffraction exposure mask. After the diffraction exposure process, the photoresist 255 has the step coverage. That is, the predetermined portions of the photoresist are not removed, so that they have a first thickness which correspond to the data line and the TFT region of the source and drain electrodes. Also, the photoresist is completely removed above the gate pad electrode and the data pad electrode. Then, the other portions of the photoresist have a second thickness, wherein the second thickness is substantially less than the first thickness.

Figure 9B:
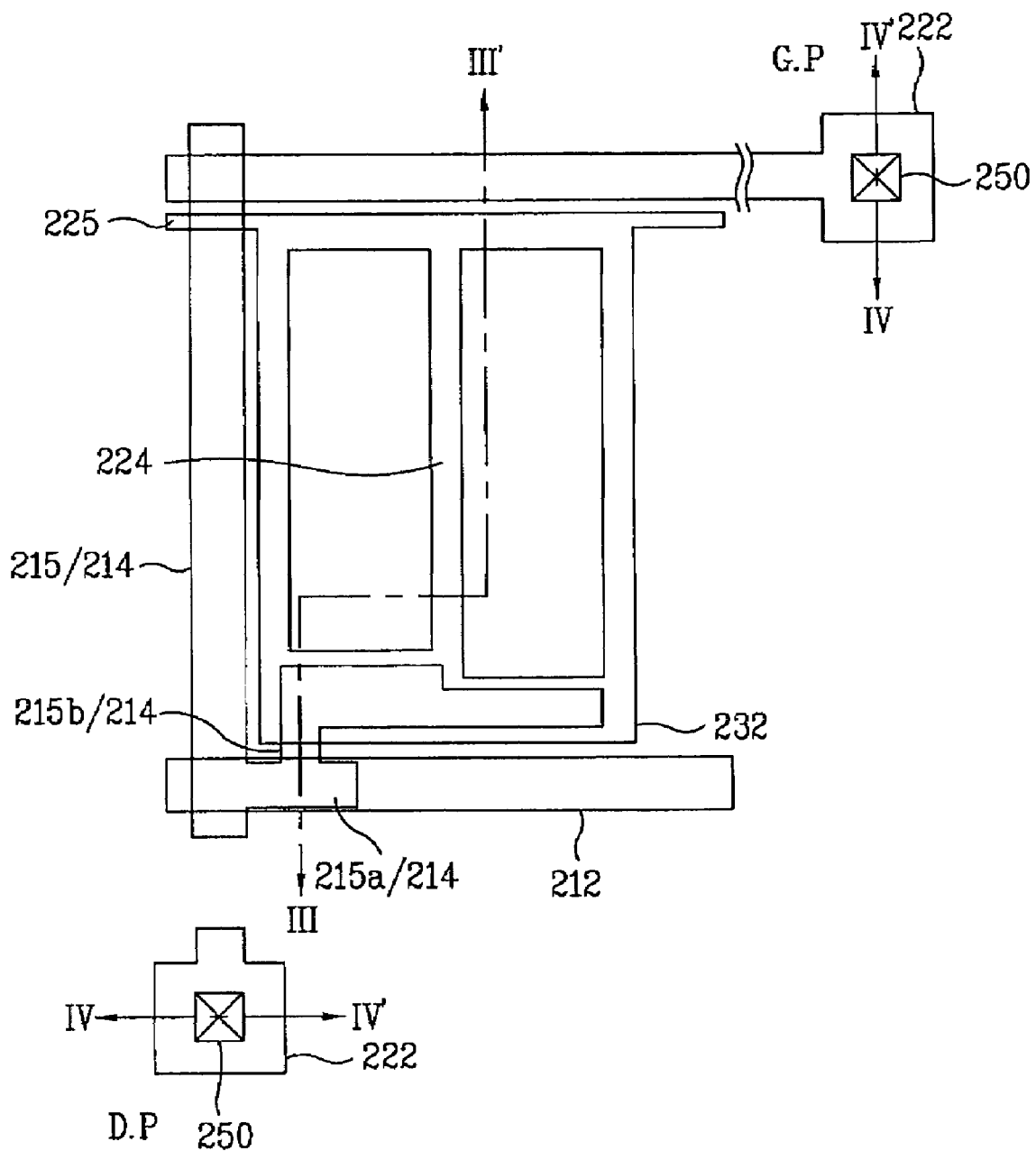
Figure 9C:
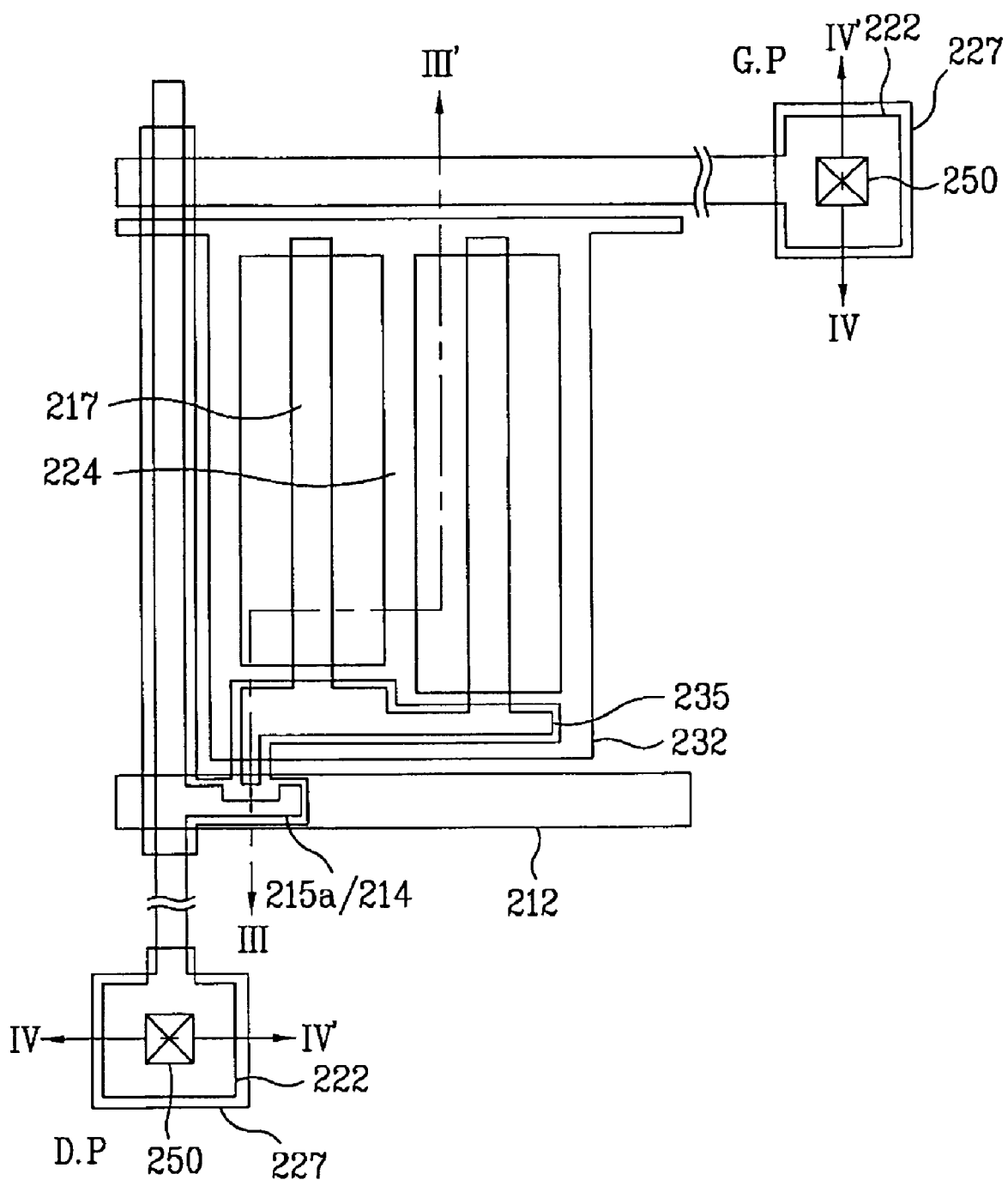
Figure 10D:
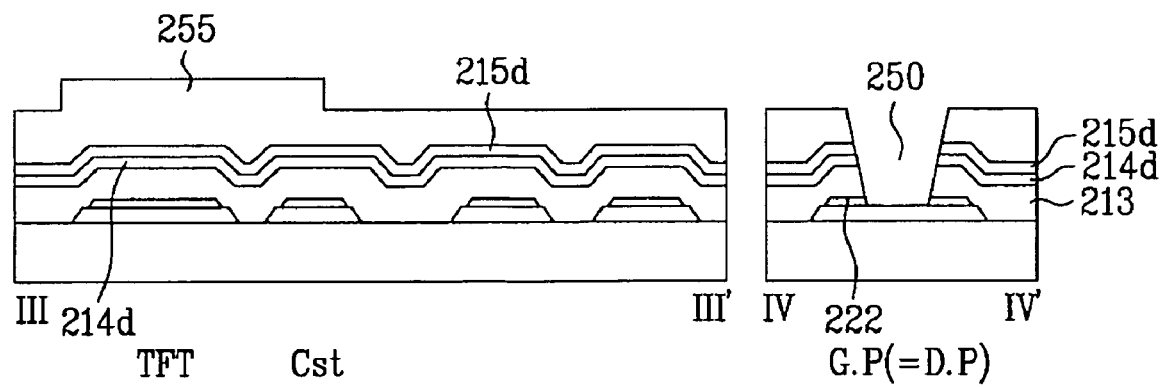

As shown in FIGS. 9B and 10D, the metal layer 215d, the amorphous silicon layer 214d, and the gate insulation layer 213 are etched by the photoresist 255 as a mask, to thereby form the open area 250 above the gate and data pad electrodes (G.P, D.P). The etching process is performed by a first step of etching the metal layer 215d provided above the pad electrode 222 by wet-etching method and a second step of etching the amorphous silicon layer 214d and the gate insulation layer 213 provided above the pad electrode 222 by a dry-etching method. In the meantime, the process of etching the metal layer, the amorphous silicon layer, and the gate insulation layer may be performed in one dry-etching chamber. If the pad electrode 222 is formed of Mo/AlNd, the molybdenum (Mo) is removed from the pad electrode when forming the open area 250.

Figure 10E:
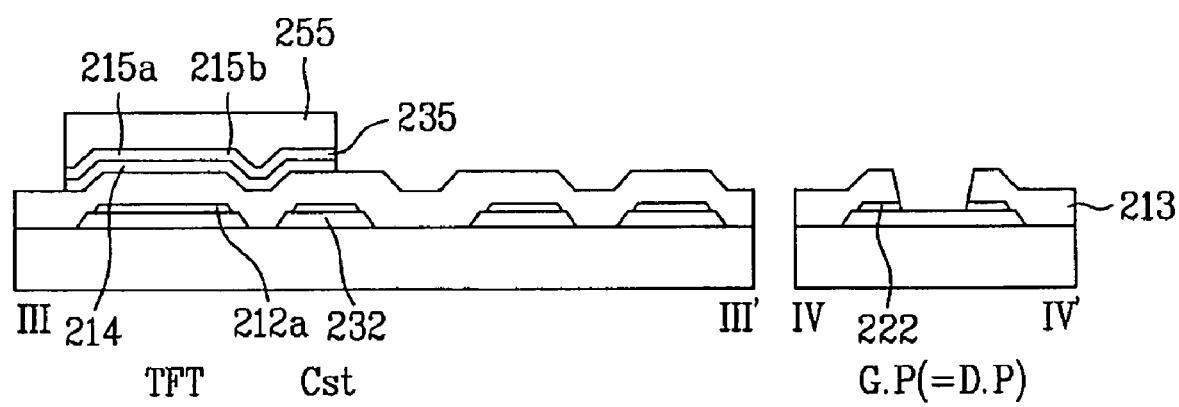

As shown in FIG. 10E, the predetermined portions of the photoresist 255 having the second thickness is completely removed by ashing the photoresist 255. Then, the metal layer 215d and the amorphous silicon layer 214d are sequentially etched using the remaining photoresist 255 as a mask, thereby forming the data line, the source and drain electrodes 215a and 215b, the upper capacitor electrode 235, and the semiconductor layer 214. The semiconductor layer 214 is positioned below the source and drain electrodes.

The upper capacitor electrode 235 is overlapped with the lower capacitor electrode 232 with the gate insulation layer 213 therebetween, thereby completing the storage capacitor (Cst). The upper capacitor electrode 235 is formed as one body with the drain electrode 215b.

As shown in FIGS. 9B and 10E, the data line is formed substantially perpendicular to the gate line 212, to thereby define the sub-pixel. Then, the semiconductor layer 214 and the source/drain electrodes 215a and 215b are formed above and overlapped with the gate electrode 212a, wherein the semiconductor layer 214 and the source/drain electrodes 215a and 215b form the thin film transistor. The data line layer and the semiconductor layer are formed by the same mask process. Thus, the semiconductor layer and the data line layer are formed in substantially the same pattern, wherein the semiconductor layer is provided below the data line and the source/drain electrodes.

Figure 10F:
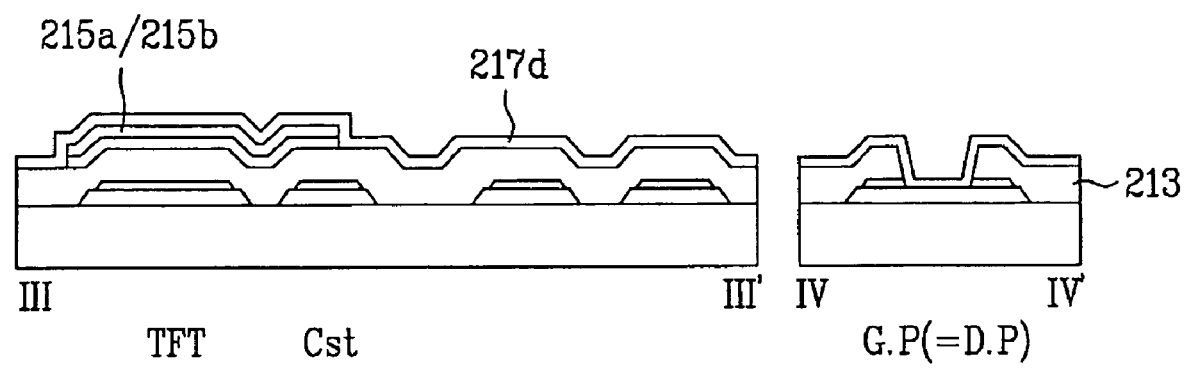
Figure 10G:
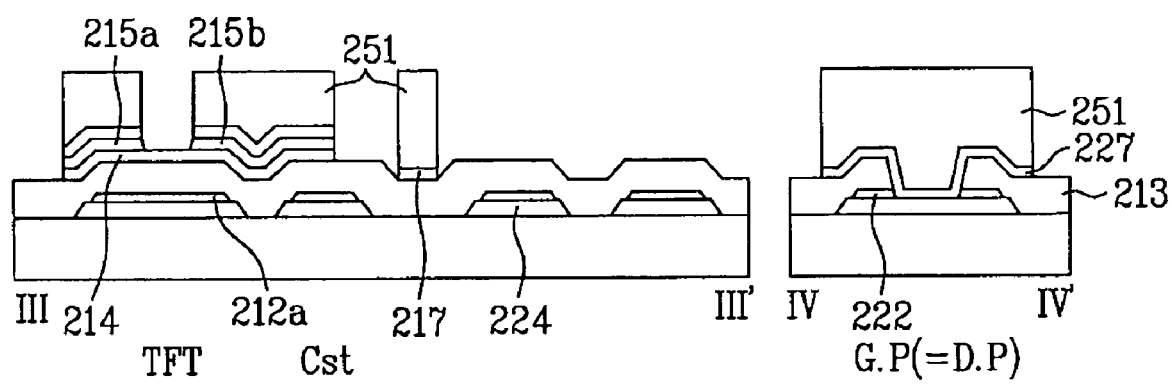

As shown in FIG. 10F, after removing the photoresist 255, a transparent conductive layer 217d is deposited on the entire surface of the substrate including the source and drain electrodes 215a and 215b, wherein the transparent conductive layer 217d is formed of Indium Tin Oxide (ITO) or Indium Zinc Oxide (IZO), by way of example. Then, as shown in FIG. 10G, a photoresist 251 is coated onto the transparent conductive layer 217d, and is then patterned by photolithography using a third exposure mask.

Then, the transparent conductive layer 217d is etched using the patterned photoresist 251 as a mask, thereby forming the pixel electrode 217 and the transparent conductive layer 227. Also, the channel region of the thin film transistor is defined by etching the space between the source and drain electrodes 215a and 215b. It is necessary to wet-etch together the transparent conductive layer and the metal layer using Hydrofluoric Acid (HF), Buffered Oxide Etchant (BOE), $NJ_4F$, or a mixed solution thereof, for example. The etchant used to etch ITO is available for the etching of molybdenum (Mo) of the source and drain electrodes.

The steps of defining the channel region and forming the pixel electrode are performed at the same time, whereby it is possible to prevent a semiconductor tail from being formed in the channel region.

Figure 10H:
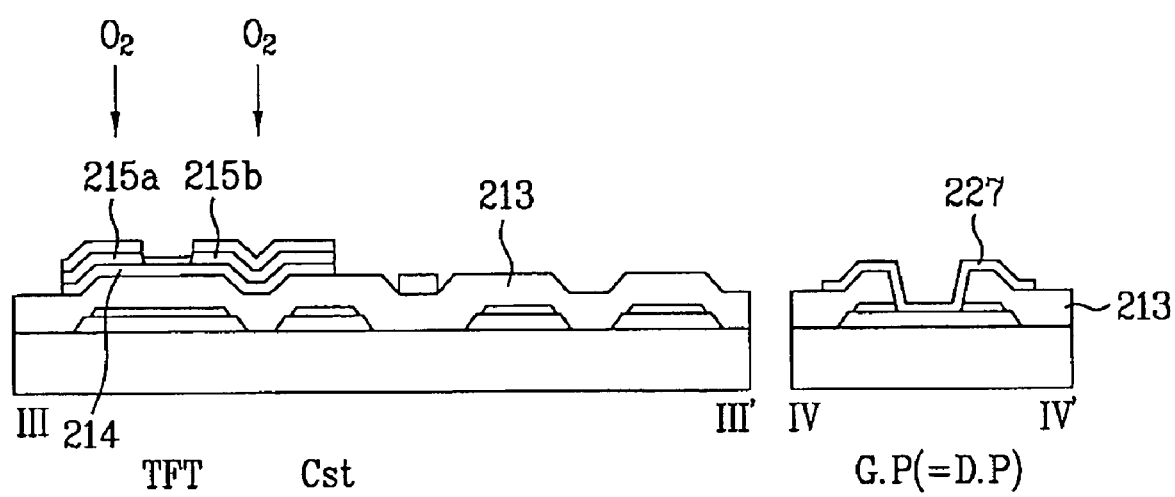

The pixel electrode 217 is directly connected with the drain electrode 215b without a contact hole, and the pixel electrode 217 is formed substantially in parallel to the common electrode 224, to thereby generate the horizontal electric field. The transparent conductive layer 227 covers the pad electrode 222, to prevent the pad electrode 222 from being oxidized. The transparent conductive layer 227 provided above the data pad electrode extends to the data line of the active region, whereby the transparent conductive layer 227 is electrically connected with the data line 215. Then, after removing the photoresist 251, as shown in FIG. 10H, the channel region of the semiconductor layer exposed between the source and drain electrodes is treated with $O_2$ plasma, thereby preventing the semiconductor layer from deteriorating by the application of ambient light.

Figure 10I:
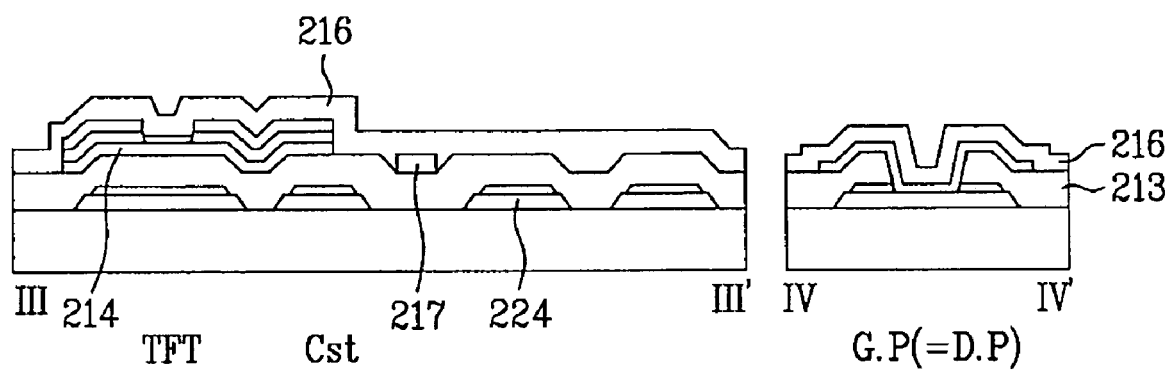
Figure 10J:
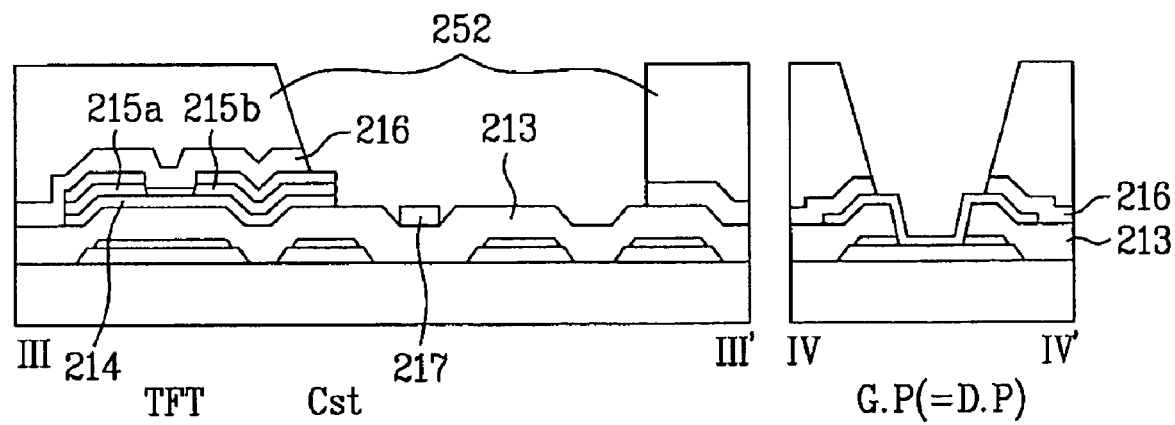

As shown in FIG. 10I, the passivation layer 216 is formed by depositing an inorganic insulation material of silicon nitride (SiNx) or silicon oxide ($SiO_2$), for example, on the entire surface of the substrate including the pixel electrode 217, or by coating an organic insulation material of BCB or acrylic resin onto the entire surface of the substrate including the pixel electrode 217. Thereon, a photoresist 252 is coated as shown in FIG. 10J, and is then patterned by photolithography using a fourth mask. Then, the passivation layer 216 exposed by the photoresist 252 is etched by a dry-etching process.

Figure 9D:
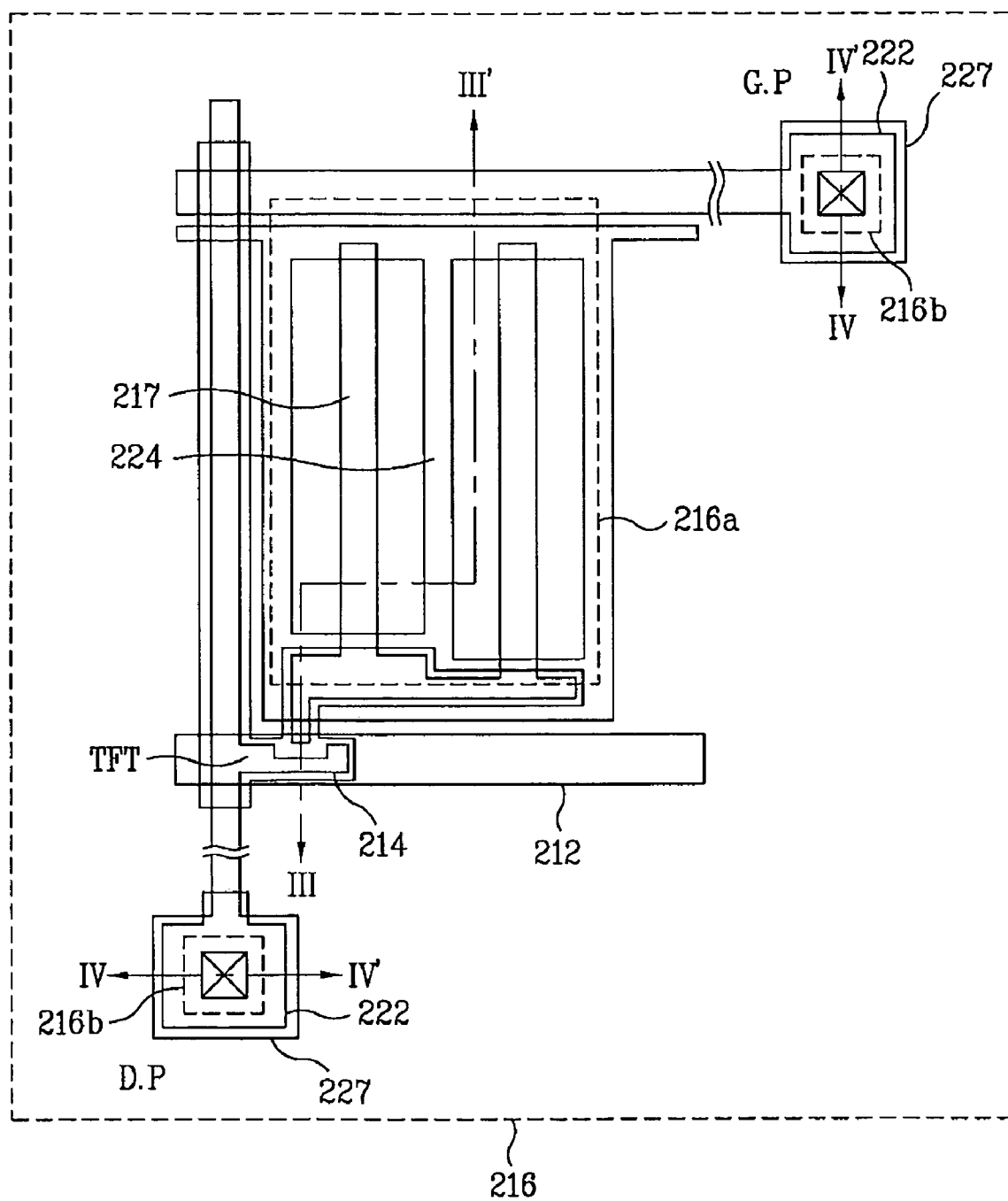
Figure 10K:
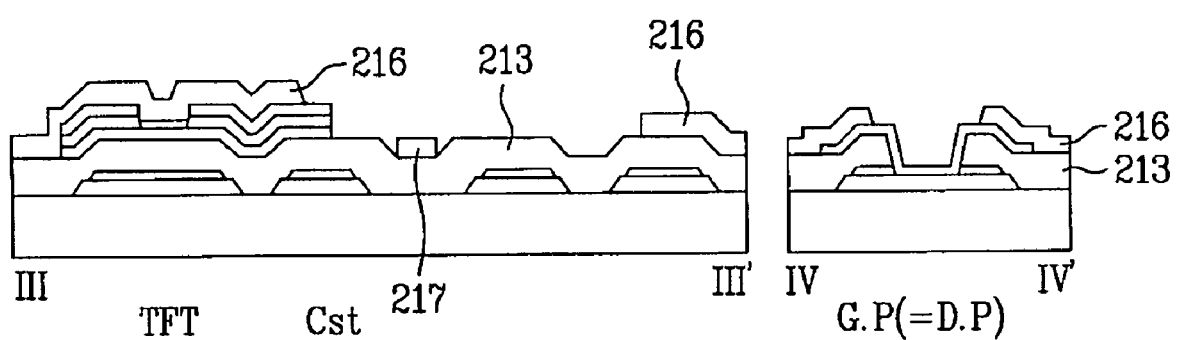

Referring to FIGS. 9D and 10K, after removing the photoresist, the passivation layer 216 is left in the remaining portions except the open area of the sub-pixel and the pad electrode. That is, the passivation layer 216a is removed from the open area of the sub-pixel, and the passivation layer 216b is removed from the pad electrode. Thus, an image is displayed through the open area of the sub-pixel from which the passivation layer is removed. Also, the pad electrode is electrically connected with an external driving circuit through the transparent conductive layer from which the passivation layer is removed. The passivation layer is formed in the channel region between the source and drain electrodes.

If performing dry-etching to the passivation layer of the opening area of the sub-pixel, the gate insulation layer 113 adjacent to the pixel electrode 117 is also etched together, whereby the under-cut phenomenon occurs at the edge of the pixel electrode.

As shown in FIGS. 11 and 12, because the passivation layer 216 is left in the active region, and the passivation layer 216b is removed from the pad electrode 222 of the pad region, it is possible to prevent the under-cut phenomenon from occurring at the edge of the pixel electrode of the active region. That is, the etching process is not applied to the passivation layer of the open area of the sub-pixel, so that it is possible to prevent the gate insulation layer positioned below the pixel electrode from being etched.

Light is absorbed by the passivation layer of the open area of the sub-pixel, whereby the transmittance of the device may be lowered. In addition to the passivation layer 216a of the open area of the sub-pixel and the passivation layer 216b of the pad electrode 222, the gate insulation layer 213a is also removed from the open area of the sub-pixel, as shown in FIGS. 13 and 14, thereby improving the transmittance of the device and preventing the under-cut phenomenon from occurring in the edge of the pixel electrode 217.

When dry-etching the gate insulation layer 213 to form the open area 250 that exposes the pad electrode 222, the gate insulation layer 213a is also removed from the open area of the sub-pixel. The common electrode 224 of the open area of the sub-pixel is also exposed to the outside.

After forming the transparent conductive layer 227 connected with the pad electrode through the open area and the pixel electrode 217 formed in parallel to the common electrode, the passivation layer 216 is formed on the entire surface of the substrate including the pixel electrode. The passivation layer 216a is removed from the open area of the sub-pixel, and the passivation layer 216b is removed from the pad electrode, whereby the pixel electrode and the transparent conductive layer are exposed to the outside.

The gate insulation layer is not formed in the sub-pixel when etching the passivation layer 216a of the open area of the sub-pixel. Thus, it is possible to prevent the under-cut phenomenon from occurring by the etching of the gate insulation layer.

Also, the gate insulation layer and the passivation layer, which absorbs light, are not formed in the sub-pixel, so that the transmittance of the device improves.

The TFT array substrate of the LCD device according to the present invention is fabricated using four exposure masks, which is appropriate for low-mask technology. Because the process of defining the channel region is performed together with the process of forming the pixel electrode, it is possible to prevent the semiconductor tail from being formed when defining the channel region.

In a preferred embodiment of the present invention, the data pad electrode and the gate pad electrode are formed on the same layer, and the data pad electrode is connected with the data line by etching the transparent conductive layer of the pad region to the data line of the active region. However, the present invention is not limited to this structure. The data pad electrode and the data line may be formed on the same layer, to obtain a simplified structure.

As mentioned above, the TFT array substrate according to the present invention and the method for fabricating the same have the following advantages.

First, the process of defining the channel region is performed together with the process of forming the pixel electrode, so that it is possible to prevent a semiconductor tail from being formed in the channel region. The semiconductor tail may cause wavy noise whenever the backlight unit (B/L) is turned-on/off.

Also, because the semiconductor tail is not formed outside of the data line, it is possible to prevent the aperture ratio from being lowered by the area of the semiconductor tail. Thus, the black matrix (which prevents light leakage) decreases in size.

Also, the turn-off current may be increased due to the photocurrent of the semiconductor tail. By removing the semiconductor tail, it is possible to prevent the turn-off current of the device from being increased.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of fabricating a TFT array substrate comprising:
    forming a gate line, a gate electrode, a common electrode and a pad electrode on a substrate;
    sequentially depositing a gate insulation layer, a silicon layer and a metal layer on an entire surface of the substrate including the gate line;
    forming an open area in the pad electrode;
    forming a semiconductor layer, data line and source/drain electrodes by patterning the silicon layer and the metal layer;
    forming a pixel electrode connected with the drain electrode and a transparent conductive layer connected with the pad electrode by depositing and patterning a transparent conductive material on the substrate including the data line, and simultaneously defining a channel region by separating the source and drain electrodes from each other, and
    forming a passivation layer over the substrate,
    wherein an $O_2$ plasma treatment is performed on the channel region of an exposed semiconductor layer between the source electrode and the drain electrode after defining the channel region,
    wherein the gate and data lines are formed substantially perpendicular to one another to define a sub-pixel,
    wherein the gate insulation layer in the open area of the sub-pixel is removed to expose the common electrode when forming the open area in the pad electrode, before forming the pixel electrode,
    wherein the passivation layer is removed from the open area of the sub-pixel and pad electrode, whereby the pixel electrode and the transparent conductive layer are exposed to an outside.

2. The method of claim 1, wherein the etching process for forming the pixel electrode and the etching process for separating the source and drain electrodes from each other are performed at the same time.

3. The method of claim 1, wherein an implantation process is performed to implant $n^+$-type impurity ions in the channel region of the exposed semiconductor layer before performing the $O_2$ plasma treatment.

4. The method of claim 1, wherein the channel region is covered with the passivation layer.

5. The method of claim 1, wherein the process of forming the open area in the pad electrode and the process of forming the semiconductor layer, the data line and source/drain electrodes by patterning the silicon layer and the metal layer are performed by one photolithography process.

6. The method of claim 5, wherein the process of forming the open area in the pad electrode and the process of forming the semiconductor layer, the data line and source/drain electrodes by patterning the silicon layer and the metal layer include:
    coating a photoresist onto the metal layer;
    patterning the photoresist the step coverage, whereby the photoresist has varied thicknesses therein;
    forming the open area in the pad electrode by etching the gate insulation layer, the silicon layer and the metal layer exposed by the patterned photoresist;
    ashing the photoresist to remove a substantially small thickness; and
    forming the semiconductor layer, the data line and source/drain electrodes by patterning the gate insulation layer, the silicon layer and the metal layer using the ashed photoresist as a mask.

7. The method of claim 6, wherein the silicon layer and the metal layer are etched at the same time, in the step of forming the semiconductor layer, the data line and the source/drain electrodes by patterning the gate insulation layer, the silicon layer and the metal layer using the ashed photoresist as a mask.

8. The method of claim 6, wherein the process of patterning the photoresist of the step coverage uses a diffraction exposure mask.

9. The method of claim 6, wherein the process of etching the gate insulation layer, the silicon layer and the metal layer includes:
    etching the metal layer above the pad electrodes by a wet-etching method; and
    etching the silicon layer and the gate insulation layer above the pad electrode by a dry-etching method.

10. The method of claim 6, wherein the process of etching the gate insulation layer, the silicon layer and the metal layer is performed in one dry-etching chamber.

11. The method of claim 1, wherein the pad electrodes include a gate pad electrode and a data pad electrode.

12. The method of claim 11, wherein the gate pad electrode is formed as one body with the gate line, and the data pad electrode is connected with the data line.

13. The method of claim 11, wherein the transparent conductive layer contacting the data pad electrode extends to the data line so that the transparent conductive layer contacts with the data line.

14. The method of claim 1, wherein a gate pad electrode is formed as one body with the gate line when forming the pad electrode, and a data pad electrode is formed as one body with the data line when forming the data line.

15. The method of claim 1, wherein a lower capacitor electrode is formed when forming the gate line.

16. The method of claim 15, wherein an upper capacitor electrode is electrically connected with the drain or pixel electrode formed on the gate insulation layer above the lower capacitor electrode.

17. The method of claim 1, wherein the pixel electrode is formed inside the entire area of the sub-pixel.

18. The method of claim 1, wherein a plurality of pixel electrodes are formed in the sub-pixel, and the common electrode is formed substantially in parallel to the pixel electrodes.

19. The method of claim 18, wherein the common electrode and the gate line are formed at the same time.

* * * * *